(12) United States Patent
Faguet et al.

(10) Patent No.: US 8,815,014 B2
(45) Date of Patent: Aug. 26, 2014

(54) METHOD AND SYSTEM FOR PERFORMING DIFFERENT DEPOSITION PROCESSES WITHIN A SINGLE CHAMBER

(75) Inventors: Jacques Faguet, Albany, NY (US);
Masahide Iwasaki, Tokyo (JP);
Toshihisa Nozawa, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 680 days.

(21) Appl. No.: 13/024,328

(22) Filed: Feb. 10, 2011

(65) Prior Publication Data

US 2011/0135842 A1 Jun. 9, 2011

Related U.S. Application Data

(63) Continuation-in-part of application No. 11/281,343, filed on Nov. 18, 2005, now abandoned.

(51) Int. Cl.
*C23C 16/00* (2006.01)
*C23F 1/00* (2006.01)

(52) U.S. Cl.
USPC ............. 118/719; 118/723 MW; 156/345.35; 156/345.36; 156/345.41

(58) Field of Classification Search
USPC ................ 118/719, 723 MV, 733, 723 ME; 156/345.31–345.32, 345.33–345.34, 156/345.36, 345.41
See application file for complete search history.

(56) References Cited

U.S. PATENT DOCUMENTS

| | | | |
|---|---|---|---|
| 5,762,751 A * | 6/1998 | Bleck et al. | 156/345.23 |
| 5,935,336 A | 8/1999 | Sandhu et al. | |
| 6,409,837 B1 * | 6/2002 | Hillman | 118/712 |
| 6,630,201 B2 | 10/2003 | Chiang et al. | |
| 6,875,281 B2 * | 4/2005 | Kitano et al. | 118/719 |
| 7,396,431 B2 * | 7/2008 | Chen et al. | 156/345.33 |
| 7,422,636 B2 * | 9/2008 | Ishizaka | 118/719 |
| 2003/0024900 A1 | 2/2003 | Johnson | |
| 2004/0144311 A1 | 7/2004 | Chen et al. | |
| 2005/0268856 A1 * | 12/2005 | Miller et al. | 118/729 |
| 2006/0000411 A1 | 1/2006 | Seo et al. | |
| 2006/0040495 A1 | 2/2006 | Park et al. | |
| 2012/0186521 A1 * | 7/2012 | Iwasaki et al. | 118/723 AN |

* cited by examiner

*Primary Examiner* — Gordon R Baldwin
*Assistant Examiner* — Charlee Bennett
(74) *Attorney, Agent, or Firm* — Oblon, Spivak, McClelland, Maier & Neustadt, L.L.P.

(57) ABSTRACT

A method and system for plasma-assisted thin film vapor deposition on a substrate is described. The system includes a process chamber including a first process space having a first volume, a substrate stage coupled to the process chamber and configured to support a substrate and expose the substrate to the first process space, a plasma generation system coupled to the process chamber and configured to generate plasma in at least a portion of the first process space, and a vacuum pumping system coupled to the process chamber and configured to evacuate at least a portion of the first process space. The system further includes a process volume adjustment mechanism coupled to the process chamber and configured to create a second process space that includes at least a part of the first process space and that has a second volume less than the first volume, the substrate being exposed to the second process space.

15 Claims, 21 Drawing Sheets

METHOD AND SYSTEM FOR PERFORMING DIFFERENT DEPOSITION PROCESSES WITHIN A SINGLE CHAMBER

CROSS REFERENCE TO RELATED APPLICATIONS

This application is a continuation-in-part of U.S. Ser. No. 11/281,343, filed Nov. 18, 2005, and published as U.S. Pat. Appl. Publ. No. 2007/0116888. The entire content of this application is herein incorporated by reference. This application is related to U.S. Ser. No. 11/090,255, entitled "PLASMA ENHANCED ATOMIC LAYER DEPOSITION SYSTEM", filed Mar. 28, 2005, published as U.S. Pat. Appl. Publ. No. 2006/0213437, and now abandoned, the entire contents of which are incorporated herein by reference. This application is also related to U.S. Ser. No. 11/084,176, entitled "DEPOSITION SYSTEM AND METHOD", filed on Mar. 21, 2005, and published as U.S. Pat. Appl. Publ. No. 2006/0211243, the entire contents of which are incorporated herein by reference. This application is also related to U.S. Ser. No. 11/090,939, entitled "PLASMA ENHANCED ATOMIC LAYER DEPOSITION SYSTEM HAVING REDUCED CONTAMINATION", filed on Mar. 25, 2005, and issued as U.S. Pat. No. 7,422,636, the entire contents of which are incorporated herein by reference. This application is also related to U.S. Ser. No. 11/281,342, entitled "METHOD AND SYSTEM FOR PERFORMING PLASMA ENHANCED ATOMIC LAYER DEPOSITION", filed on Nov. 18, 2005, and published as U.S. Pat. Appl. Publ. No. 2007/0116887, the entire contents of which are incorporated herein by reference.

BACKGROUND OF THE INVENTION

1. Field of Invention

The present invention relates to a deposition system and a method of operating thereof, and more particularly to a deposition system having multiple process spaces for material deposition.

2. Description of Related Art

Typically, during materials processing, when fabricating composite material structures, plasma is employed to facilitate the addition and removal of material films. For example, in semiconductor processing, a dry plasma etch process is often utilized to remove or etch material along fine lines or within vias or contacts patterned on a silicon substrate. Alternatively, for example, a vapor deposition process is utilized to deposit material along fine lines or within vias or contacts on a silicon substrate. In the latter, vapor deposition processes include chemical vapor deposition (CVD), and plasma enhanced chemical vapor deposition (PECVD).

In PECVD, plasma is utilized to alter or enhance the film deposition mechanism. For instance, plasma excitation generally allows film-forming reactions to proceed at temperatures that are significantly lower than those typically required to produce a similar film by a thermal CVD process that thermally heats the process gas (without plasma excitation) to temperatures near or above the dissociation temperature of the process gas. In addition, plasma excitation may activate film-forming chemical reactions that are not energetically or kinetically favored in thermal CVD. The chemical and physical properties of PECVD films may thus be varied over a relatively wide range by adjusting process parameters.

More recently, atomic layer deposition (ALD) and plasma enhanced ALD (PEALD) have emerged as candidates for ultra-thin gate film formation in front end-of-line (FEOL) operations, as well as ultra-thin barrier layer and seed layer formation for metallization in back end-of-line (BEOL) operations. In ALD, two or more process gases, such as a film precursor and a reduction gas, are introduced alternatingly and sequentially while the substrate is heated in order to form a material film one monolayer at a time. In PEALD, plasma is formed during the introduction of the reduction gas to form a reduction plasma. To date, ALD and PEALD processes have proven to provide improved uniformity in layer thickness and conformality to features on which the layer is deposited, albeit these processes are slower than their CVD and PECVD counterparts.

SUMMARY OF THE INVENTION

One object of the invention is directed to addressing various problems with semiconductor processing at ever decreasing line sizes where conformality, adhesion, and purity are becoming increasingly important issues affecting the resultant semiconductor device.

Another object of the invention is to reduce contamination problems between interfaces of subsequently deposited material layers.

Another object of the invention is to provide a deposition system capable of changing a process volume size in order to accommodate different deposition processes.

Another object of the present invention is to provide a configuration compatible for vapor deposition and plasma enhanced vapor deposition processes within the same system.

Variations of these and/or other objects of the present invention are provided by certain embodiments of the present invention.

According to one embodiment, a system for plasma-assisted thin film vapor deposition on a substrate is described. The system includes a processing chamber including a first process space having a first volume, a substrate stage coupled to the processing chamber and configured to support a substrate and expose the substrate to the first process space, a plasma generation system coupled to the processing chamber and configured to generate plasma in at least a portion of the first process space, and a vacuum pumping system coupled to the processing chamber and configured to evacuate at least a portion of the first process space. The system further includes a process volume adjustment mechanism coupled to the processing chamber and configured to create a second process space that includes at least a part of the first process space and that has a second volume less than the first volume, the substrate being exposed to the second process space.

According to another embodiment, a method for plasma-assisted thin film vapor deposition on a substrate is described. The method includes disposing a substrate on a substrate stage in a processing chamber, wherein the processing chamber has a process volume defined by a first process space having a first volume, and forming a thin film on the substrate using a plasma enhanced atomic layer deposition (PEALD) process. The PEALD process includes introducing a film precursor to a surface of the substrate by: adjusting the process volume in the processing chamber to create a second process space, enclosed within the processing chamber, that includes at least a part of the first process space and that has a second volume less than the first volume, introducing a first process material containing the film precursor to the second process space during a first time duration, and exposing the substrate to the first process material in the second process space during the first time duration. The PEALD process further includes reacting the film precursor on the surface of the substrate with plasma to form the thin film by: adjusting the process volume in the processing chamber to re-create the first process space, introducing a second process material to the first process space, generating plasma in at least a portion of the first process space from the second process material, and exposing the substrate to the first process space for a second time duration following the first time duration.

BRIEF DESCRIPTION OF THE DRAWINGS

In the accompanying drawings, a more complete appreciation of the present invention and many attendant advantages thereof will be readily obtained as the same becomes better understood by reference to the following detailed description when considered in connection with the accompanying drawings, wherein.

DETAILED DESCRIPTION OF SEVERAL EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1:
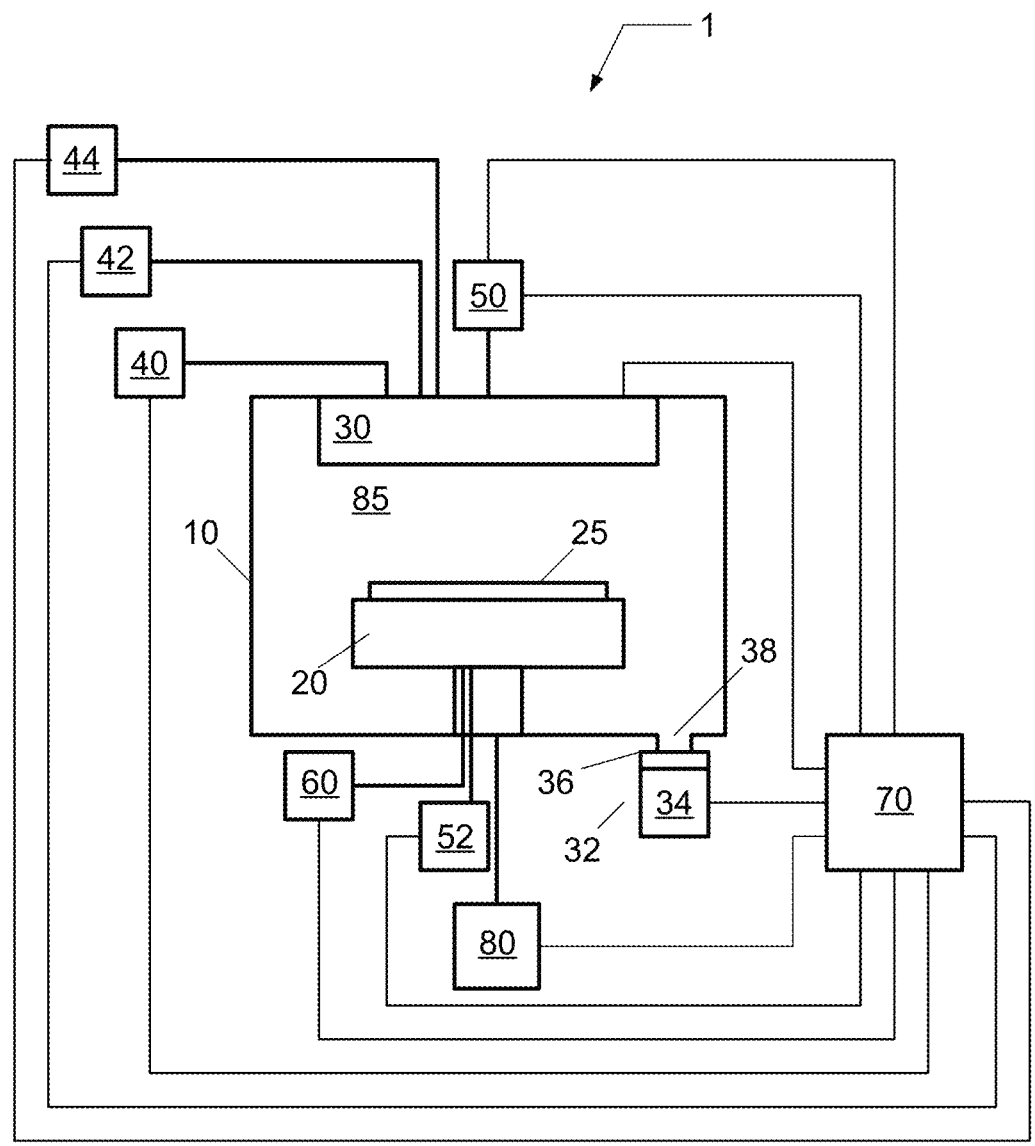
FIG. 1 depicts a schematic view of a deposition system in accordance with one embodiment of the invention.

Referring now to the drawings, wherein like reference numerals designate identical or corresponding parts throughout the several views, FIG. 1 illustrates a deposition system 1 for depositing a thin film, for example a barrier film, on a substrate using a vapor deposition process, such as a chemical vapor deposition (CVD) process, a plasma enhanced CVD (PECVD) process, an atomic layer deposition (ALD) process, or a plasma enhanced ALD (PEALD) process. During the metallization of inter-connect and intra-connect structures for semiconductor devices in back-end-of-line (BEOL) operations, a thin conformal barrier layer may be deposited on wiring trenches or vias to minimize the migration of metal into the inter-level or intra-level dielectric, a thin conformal seed layer may be deposited on wiring trenches or vias to provide a film with acceptable adhesion properties for bulk metal fill, and/or a thin conformal adhesion layer may be deposited on wiring trenches or vias to provide a film with acceptable adhesion properties for metal seed deposition. In addition to these processes, a bulk metal such as copper must be deposited within the wiring trench or via.

Oftentimes, for thin conformal films, i.e., barrier layers or seed layers, in back end metallization schemes, it is desirable to use a non-plasma deposition process, such as a thermal vapor deposition process, when depositing the initial thin conformal film over interlevel or intralevel dielectric. Particularly, when this dielectric layer comprises a low dielectric constant (low-k) material, exposure to plasma can cause damage to the low-k layer, that may, for example, affect an increase in the dielectric constant of the film. After using a thermal vapor deposition process to deposit the initial layer, a plasma assisted deposition process may be utilized to improve deposition rate or film morphology or both.

These processes in the past typically could require separate chambers customized to the particular needs of each of these processes as no single chamber could accommodate all of the process requirements. For example, a thin film barrier layer is preferably performed at a self-limited ALD process to provide good conformality. Because ALD requires alternating different process gases, deposition occurs at a relatively slow deposition rate. The present inventors have recognized that performing a thermal ALD process in a small process space volume allows rapid gas injection and an evacuation of the alternating gases, which shortens the ALD cycle. On the other hand, metals, such as tantalum, titanium, tungsten, or copper can be deposited at a faster deposition rate by a thermal CVD process that does not necessarily require alternate gas flows. In this process it may be beneficial to use a larger process space volume to provide more uniform deposition of the material. As another example, described above, depositing one or more layers on a substrate may include a non-plasma process as well as a plasma process. The present inventors have recognized that the non-plasma process can benefit from a small process space volume to increase throughput and/or preserve process gas while a larger process space volume is required to sustain a uniform plasma.

The need for separate chambers adds costs due to the multiplicity of deposition units, adds time to the fabrication process due to the transfer between the systems of the process wafer, and (due to the transfer between multiple deposition units) makes contamination of the exposed interfaces a concern which had to be addressed through preventive or remedial measures, thereby adding more costs and complexity to the fabrication process.

In FIG. 1, deposition system 1 according to one embodiment of the present invention includes a processing chamber 10 having a substrate stage 20 configured to support a substrate 25, upon which a thin film is to be formed. Additionally, the deposition system 1 as illustrated in FIG. 1 includes a process volume adjustment system 80 coupled to the processing chamber 10 and the substrate stage 20, and configured to adjust the volume of the process space adjacent substrate 25. For example, the process volume adjustment system 80 can be configured to vertically translate the substrate stage 20 between a first position creating a first process space 85 with a first volume (see FIG. 1) and a second position creating a second process space 85' with a second volume (see FIG. 2).

Figure 2:
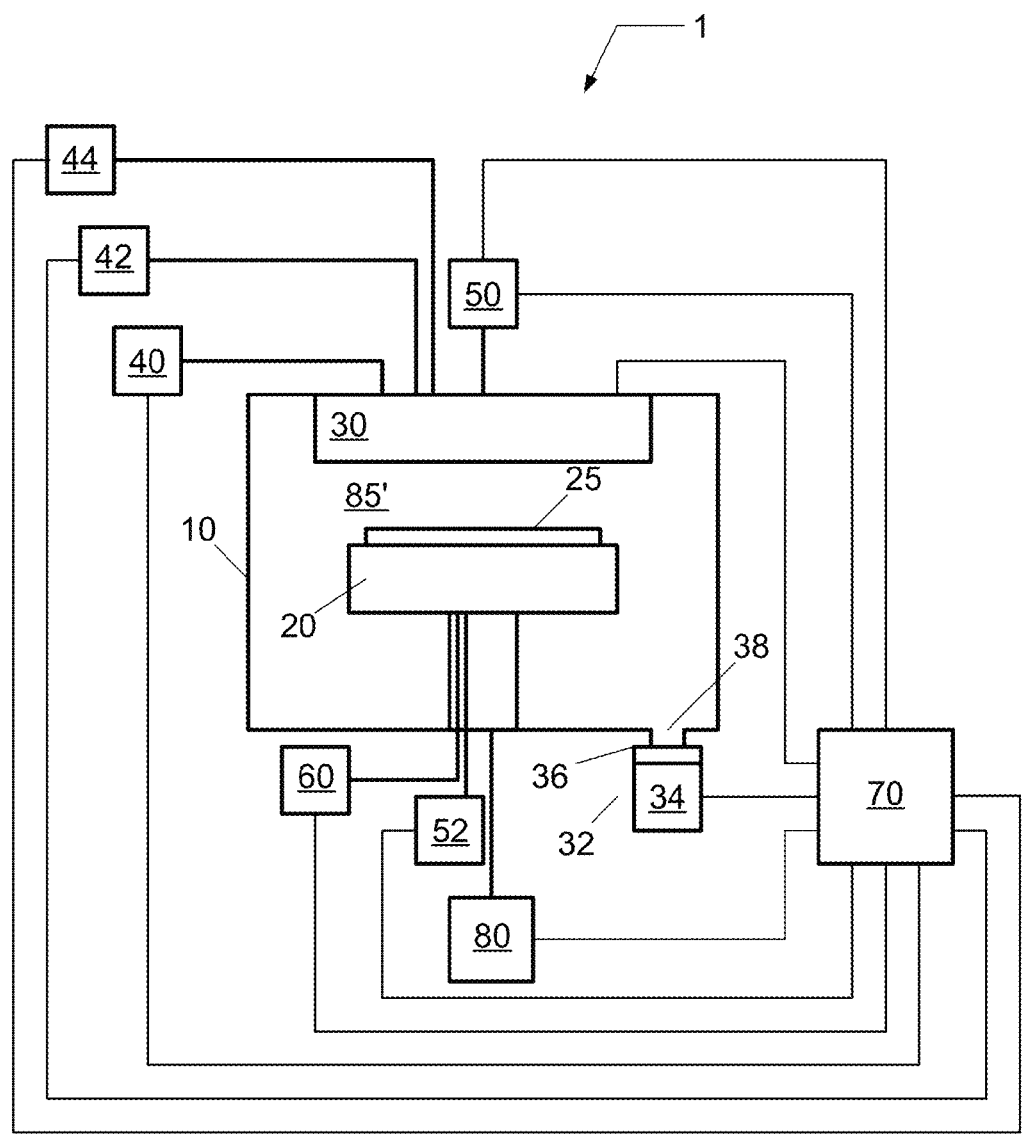
FIG. 2 depicts a schematic view of the deposition system of FIG. 1 showing an enlarged process space in accordance with one embodiment of the invention.

As illustrated in FIGS. 1 and 2, deposition system 1 can include a substrate temperature control system 60 coupled to the substrate stage 20 and configured to elevate and control the temperature of substrate 25. Substrate temperature control system 60 can include temperature control elements, such as a cooling system including a re-circulating coolant flow that receives heat from substrate stage 20 and transfers heat to a heat exchanger system (not shown), or when heating, transfers heat from the heat exchanger system. Additionally, the temperature control elements can include heating/cooling elements, such as resistive heating elements, or thermo-electric heaters/coolers can be included in the substrate stage 20, as well as the chamber wall of the processing chamber 10 and any other component within the deposition system 1.

In order to improve the thermal transfer between substrate 25 and substrate stage 20, substrate stage 20 can include a mechanical clamping system, or an electrical clamping system, such as an electrostatic clamping system, to affix substrate 25 to an upper surface of substrate stage 20. Furthermore, substrate stage 20 can further include a substrate backside gas delivery system configured to introduce gas to the backside of substrate 25 in order to improve the gas-gap thermal conductance between substrate 25 and substrate stage 20. Such a system can be utilized when temperature control of the substrate is required at elevated or reduced temperatures. For example, the substrate backside gas system can include a two-zone gas distribution system, wherein the helium gas gap pressure can be independently varied between the center and the edge of substrate 25.

The substrate stage 20 along with in vacuo mechanisms to translate the substrate stage and interior mechanisms for substrate temperature control system 60 can constitute a lower chamber assembly of the processing chamber 10.

The processing chamber 10 can further include an upper chamber assembly 30 coupled to a first process material gas supply system 40, a second process material gas supply system 42, and a purge gas supply system 44. As such, the upper chamber assembly 30 can provide the first process material and the second process material to process space 85. A showerhead design, as known in the art, can be used to uniformly distribute the first and second process gas materials into the process space 85. Exemplary showerheads are described in greater detail in U.S. Pat. Application Pub. No. 20040123803, the entire contents of which is incorporated herein by reference in its entirety, and in previously incorporated by reference U.S. Ser. No. 11/090,255.

The deposition system 1 may be configured to process 200 mm substrates, 300 mm substrates, or larger-sized substrates. In fact, it is contemplated that the deposition systems described in the present invention may be configured to process substrates, wafers, or LCDs regardless of their size, as would be appreciated by those skilled in the art. Substrates can be introduced to processing chamber 10, and the substrate may be lifted to and from an upper surface of substrate stage 20 via a substrate lift system (not shown).

According to one embodiment of the present invention, the first process material gas supply system 40 and the second process material gas supply system 42 can be configured to sequentially and optionally alternatingly introduce a first process gas material to processing chamber 10 and a second process gas material to processing chamber 10 in order to sequentially and optionally alternatingly deposit first and second films on substrate 25. The alternation of the introduction of the first process gas material and the introduction of the second process gas material can be cyclical, or it may be acyclical with variable time periods between introduction of the first and second process gas materials. The first and second process gas materials can, for example, include a gaseous film precursor, such as a composition having the principal atomic or molecular species found in the films formed on substrate 25. The gaseous film precursor can originate as a solid phase, a liquid phase, or a gaseous phase, and may be delivered to processing chamber 10 in a gaseous phase. The first and second process gas materials can, for example, include a reduction gas. For instance, the reduction gas can originate as a solid phase, a liquid phase, or a gaseous phase, and may be delivered to processing chamber 10 in a gaseous phase. Examples of gaseous film precursors and reduction gases are given below.

When introducing the first process gas material or the second process gas material to form the first film or the second film, respectively, the gaseous components, i.e., film precursor and reduction gas, of the first process gas material or the second process gas material may be introduced together at the same time to processing chamber 10. For example, the film precursor and the reduction gas may be mixed or they may be un-mixed prior to introduction to processing chamber 10. Alternatively, the gaseous components of the first process gas material or the second process gas material may be sequentially and alternatingly introduced to processing chamber 10. Plasma may or may not be utilized to assist the deposition of the first film and the second film on substrate 25 using the first process gas material and the second process gas material, respectively.

The first material supply system 40, the second material supply system 42, and the purge gas supply system 44 can include one or more material sources, one or more pressure control devices, one or more flow control devices, one or more filters, one or more valves, or one or more flow sensors. The flow control devices can include pneumatic driven valves, electro-mechanical (solenoidal) valves, and/or high-rate pulsed gas injection valves. An exemplary pulsed gas injection system is described in greater detail in U.S. Pat. Application Pub. No. 20040123803, the entire contents of which are incorporated herein by reference.

Referring still to FIG. 1, the deposition system 1 in one embodiment of the present invention can include a plasma generation system configured to generate plasma during at least a portion of the sequential and optional alternating introduction of the first process gas material and the second process gas material to processing chamber 10. The plasma generation system can include a first power source 50 coupled to the processing chamber 10, and configured to couple power to the first process gas material, or the second process gas material, or both, or gaseous components of the first process gas material, or gaseous components of the second process gas material. The first power source 50 may include a radio frequency (RF) generator and an impedance match network (not shown), and may further include an electrode (not shown) through which RF power is coupled to plasma in processing chamber 10. The electrode can be formed in the upper assembly 30, and it can be configured to oppose the substrate stage 20.

The impedance match network can be configured to optimize the transfer of RF power from the RF generator to the plasma by matching the output impedance of the match network with the input impedance of the processing chamber, including the electrode, and plasma. For instance, the impedance match network serves to improve the transfer of RF power to plasma in plasma processing chamber 10 by reducing the reflected power. Match network topologies (e.g. L-type, π-type, T-type, etc.) and automatic control methods are well known to those skilled in the art. A typical frequency for the RF power can range from about 0.1 MHz to about 100 MHz. Alternatively, the RF frequency can, for example, range from approximately 400 kHz to approximately 60 MHz, By way of further example, the RF frequency can, for example, be approximately 13.56 or 27.12 MHz.

The deposition system 1 in one embodiment of the present invention can include a substrate bias generation system configured to generate a plasma during at least a portion of the alternating and cyclical introduction of the first process gas material and the second process gas material to processing chamber 10. The substrate bias system can include a second power source 52 coupled to the processing chamber 10, and configured to couple power to substrate 25. The second power source 52 may include a radio frequency (RF) generator and an impedance match network, and may further include an electrode through which RF power is coupled to substrate 25. The electrode can be formed in substrate stage 20. For instance, substrate stage 20 can be electrically biased with a DC voltage or at an RF voltage via the transmission of RF power from an RF generator (not shown) through an impedance match network (not shown) to substrate stage 20. A typical frequency for the RF bias can range from about 0.1 MHz to about 100 MHz. RF bias systems for plasma processing are well known to those skilled in the art. Alternately, RF power can be applied to the substrate stage electrode at multiple frequencies. Alternatively, the RF frequency can, for example, range from approximately 400 kHz to approximately 60 MHz, By way of further example, the RF frequency can, for example, be approximately 13.56 or 27.12 MHz. The substrate bias generation system may operate at a different or the same frequency as the plasma generation system.

Although the plasma generation system and the substrate bias system are illustrated in FIG. 1 as separate entities, these systems may include one or more power sources coupled to substrate stage 20.

Furthermore, the processing chamber 10 is coupled to a pressure control system 32, including for example a vacuum pumping system 34 and a valve 36, through a duct 38. The pressure control system 34 is configured to controllably evacuate the processing chamber 10 to a pressure suitable for forming the thin film on substrate 25, and suitable for use of the first and second process materials.

The vacuum pumping system 34 can include a turbo-molecular vacuum pump (TMP) capable of a pumping speed up to about 5000 liters per second (and greater) and valve 36 can include a gate valve for throttling the chamber pressure. In conventional plasma processing devices utilized for dry plasma etch, a 1000 to 3000 liter per second TMP is generally employed. Moreover, a device for monitoring chamber pressure (not shown) can be coupled to the processing chamber 110. The pressure measuring device can be, for example, a Type 628B Baratron absolute capacitance manometer commercially available from MKS Instruments, Inc. (Andover, Mass.).

Figure 3:
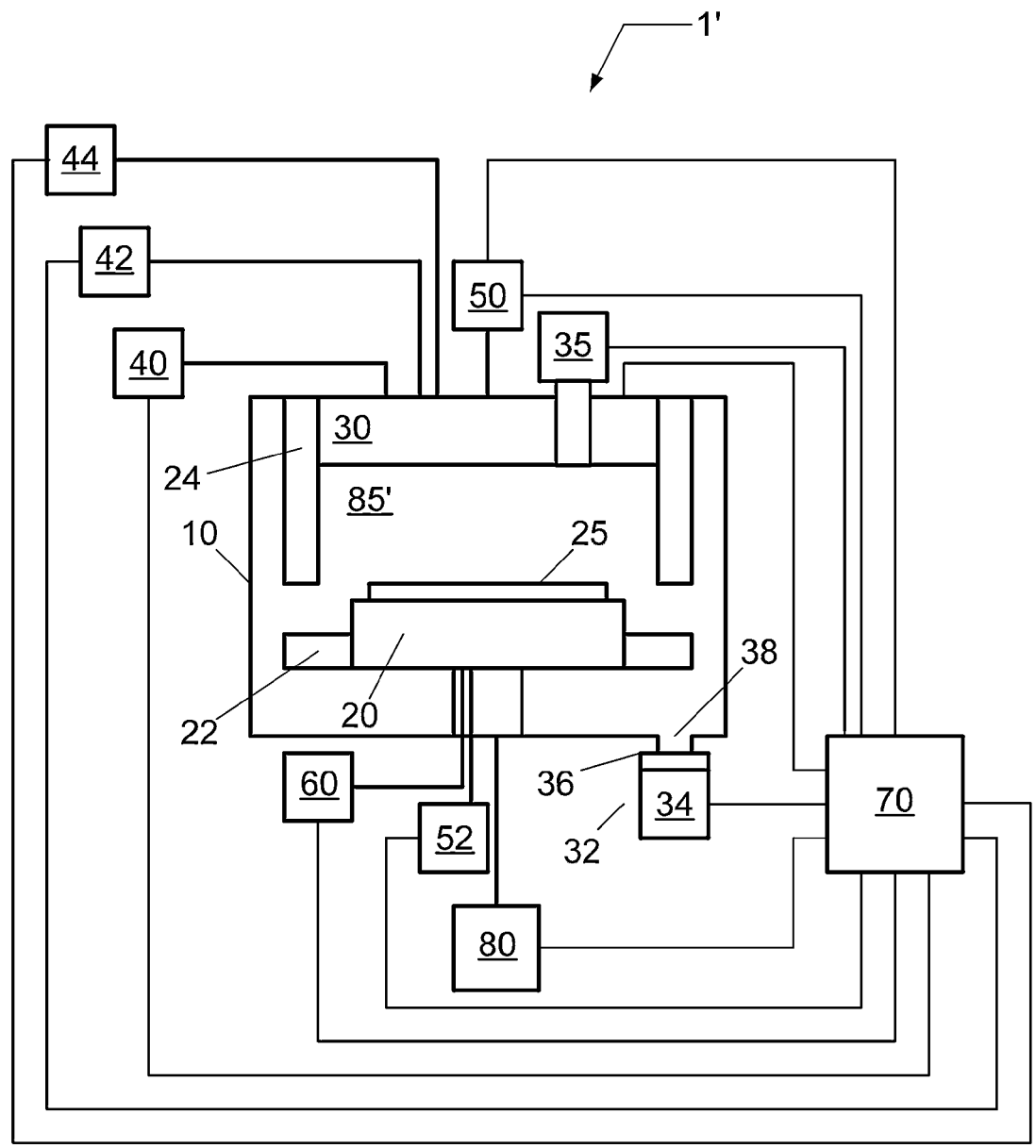
FIG. 3 depicts a schematic view of a deposition system in accordance with another embodiment of the invention.
Figure 4:
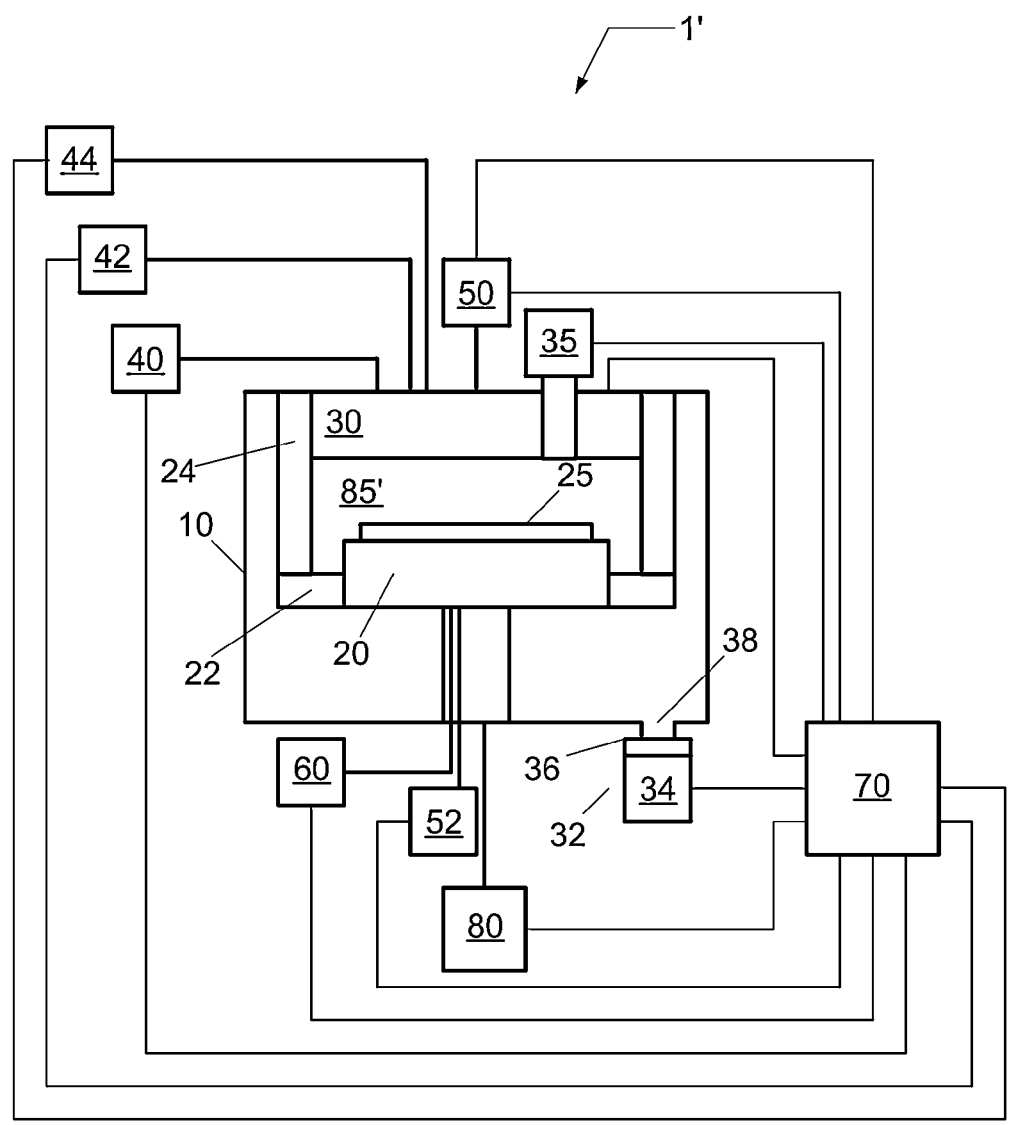
FIG. 4 depicts a schematic view of the deposition system of FIG. 3 showing an enlarged process space in accordance with one embodiment of the invention.

Referring now to FIGS. 3 and 4, a deposition system 1' is illustrated for depositing a thin film, such as a barrier film, on a substrate using a vapor deposition process, such as a chemical vapor deposition (CVD) process, a plasma enhanced CVD (PECVD) process, an atomic layer deposition (ALD) process, or plasma enhanced ALD (PEALD) process according to another embodiment of the present invention. The deposition system 1' includes many of the same features as deposition system 1 illustrated in FIGS. 1 and 2, which like reference numerals represent like components. Deposition system 1' further includes a shield 24 configured to surround a peripheral edge of process space 85 in FIG. 3, or process space 85' in FIG. 4. Substrate stage 20 may further include an outer lip 22 configured to couple with shield 24 when substrate stage 20 is translated upwards to form process space 85'. For example, outer lip 22 can be configured to seal with shield 24. Shield 24 can be configured to permit passage of process gases there through (as in a perforated shield) in order to permit evacuation of process space 85'. If shield 24 is not configured to permit evacuation of process space 85', then a separate vacuum pumping system 35 similar to vacuum pumping system 34 can be used to evacuate the process space 85'.

The shield 24 depicted in FIGS. 3 and 4 can serve multiple purposes. The shield 24 can provide a simplified cylindrical geometry in which fluid flow in the process spaces 85 and 85' can be more reliably predicted or controlled. By having openings at predetermined positions of the shield (i.e., as in a perforated shield) the fluid flow can be engineered. Likewise, the shield 24 can provide a symmetrical path to electrical ground proximate the plasma edge, which can provide a uniform plasma that can be more reliably predicted or controlled. Furthermore, the shield 24 can be a replaceable unit, collecting deposits that would normally accumulate on the interior of walls 10. As such, shield 24 can be replaced in normal routine maintenance and extend the time period before the interior of walls 10 needs to be cleaned.

Figure 5:
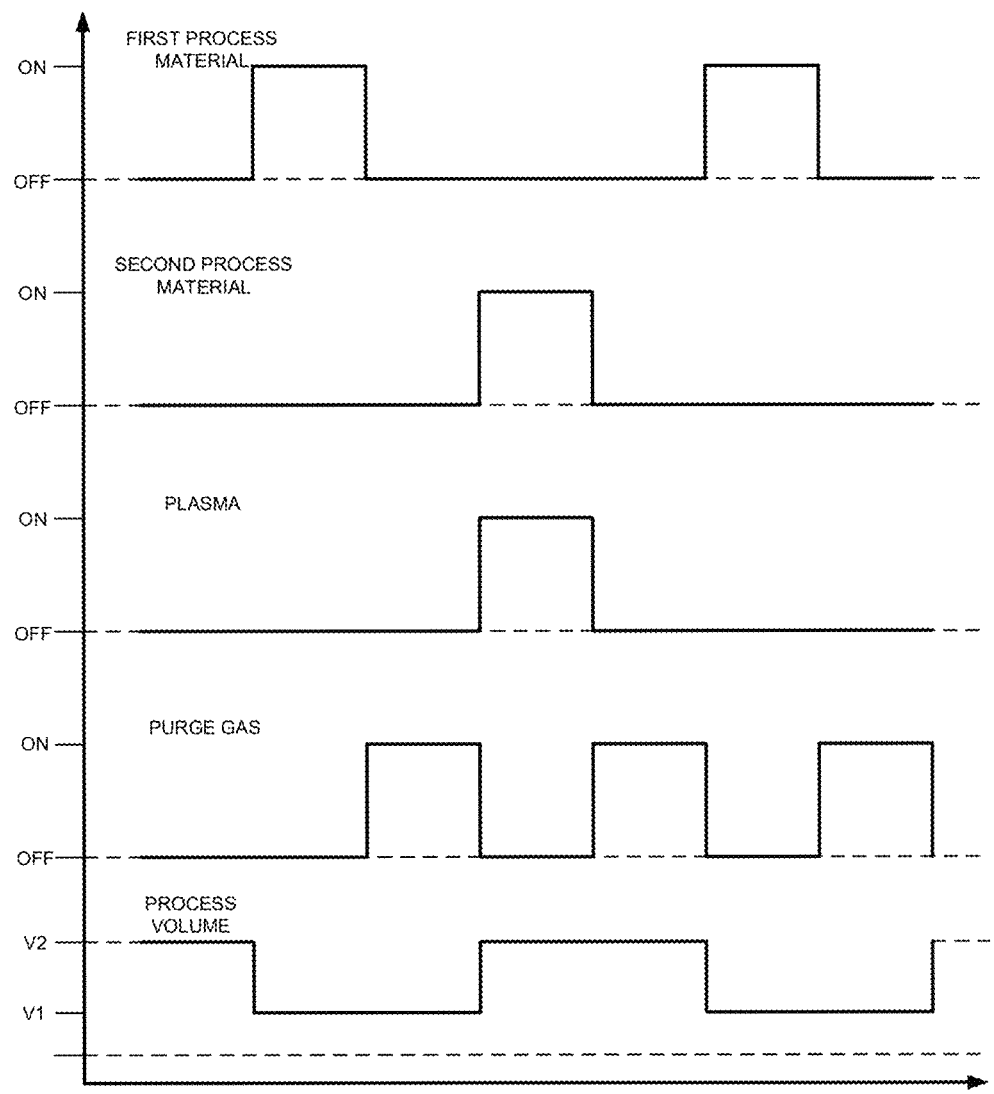
FIG. 5 depicts a schematic timing diagram according to one embodiment of the invention to be used in the deposition systems of FIGS. 1-4.

Referring now to FIG. 5, deposition system 1 or 1' can be configured to perform multiple vapor deposition processes, such as a thermally activated vapor deposition process (i.e., a deposition process not utilizing plasma) followed by a plasma enhanced vapor deposition process (i.e., a deposition process utilizing plasma). The thermally activated vapor deposition process can include a thermal atomic layer deposition (ALD) process or a thermal chemical vapor deposition (CVD) process, and the plasma enhanced vapor deposition process can include a plasma enhanced ALD process or a plasma enhanced CVD process. In one example, when depositing multiple tantalum containing films, a first deposition process such as a thermal ALD or thermal CVD process can be utilized to deposit a first film comprising Ta(C)N, and a second deposition process such as a plasma enhanced ALD process can be utilized to deposit a second film comprising Ta atop the first film.

As illustrated in FIG. 5, when performing the first deposition process, a first process gas material is introduced to the processing chamber, wherein the first process gas material includes a film precursor comprising tantalum, such as a metal halide (e.g., tantalum pentachloride) or a metal organic (e.g., Ta(NC(CH$_3$)$_2$C$_2$H$_5$)(N(CH$_3$)$_2$)$_3$; hereinafter referred to as TAIMATA®; for additional details, see U.S. Pat. No. 6,593,484) and a reduction gas, The reduction gas can, for instance, include hydrogen or ammonia.

In an ALD process, the introduction of the first process gas material to processing chamber 10 comprises sequentially and alternatingly introducing the film precursor and the reduction gas. Alternatively, in a CVD process, the introduction of the first process gas material to processing chamber 10 comprises concurrent introduction of the film precursor and the reduction gas.

For instance, in thermal ALD, the film precursor is introduced to the processing chamber 10 to cause adsorption of the film precursor to exposed surfaces of substrate 25. Preferably, a monolayer of material adsorbs to the exposed substrate surfaces. Thereafter, the reduction gas is introduced to processing chamber 10 to reduce the adsorbed film precursor in order to leave the desired film on substrate 25. By elevating the substrate temperature, the film precursor thermally decomposes and chemically reacts with the reduction gas. The introduction of the film precursor and the reduction gas are repeated in order to produce a film of a desired thickness. A purge gas may be introduced between introduction of the film precursor and the reduction gas. The purge gas can include an inert gas, such as a noble gas (i.e., helium, neon, argon, xenon, krypton).

Next, as illustrated in FIG. 5, when performing the second deposition process, a second process gas material is introduced to the processing chamber. The second process gas material can be introduced concurrent with or immediately about the time in which the process space is increased in volume from V1 to V2. The second process gas material includes a film precursor comprising tantalum, such as a metal halide (e.g., tantalum pentachloride) or a metal organic (e.g., Ta(NC(CH$_3$)$_2$C$_2$H$_5$)(N(CH$_3$)$_2$)$_3$; hereinafter referred to as TAIMATA®; for additional details, see U.S. Pat. No. 6,593,484) and a reduction gas. The reduction gas can, for instance, include hydrogen or ammonia.

In a PEALD process, the introduction of the first process gas material to processing chamber 10 comprises sequentially and alternatingly introducing the film precursor and the reduction gas, while coupling power to processing chamber 10 to form plasma during the introduction of the reduction gas. Alternatively, in a PECVD process, the introduction of the first process gas material to processing chamber 10 comprises concurrent introduction of the film precursor and the reduction gas, while coupling power to processing chamber 10 to form plasma.

During plasma formation, power is coupled through, for example, the upper assembly 30 from the first power source 50 to the second process gas material. The coupling of power to the second process gas material heats the second process gas material, thus causing ionization and dissociation of the second process gas material (i.e., plasma formation) in order to form a deposit from the constituents of the second process gas material. As shown in FIG. 5, the processing chamber 10 can be purged with a purge gas for another period of time. The introduction of the first process gas material, the introduction of the second process gas material, and the formation of the plasma while the second process gas material is present can be repeated any number of times to produce a film of desired thickness.

In one example, a thermally-driven vapor deposition process, such as an ALD or CVD process, can be used during the first process described in FIG. 5. As such, tantalum (Ta), tantalum nitride, or tantalum carbonitride can be deposited using a thermally-driven ALD process, in which a Ta carrier such as TaF$_5$, TaCl$_5$, TaBr$_5$, TaI$_5$, Ta(CO)$_5$, Ta[N(C$_2$H$_5$CH$_3$)]$_5$ (PEMAT), Ta[N(CH$_3$)$_2$]$_5$ (PDMAT), Ta[N(C$_2$H$_5$)$_2$]$_5$ (PDEAT), Ta(NC(CH$_3$)$_3$)(N(C$_2$H$_5$)$_2$)$_3$ (TBTDET), Ta(NC$_2$H$_5$)(N(C$_2$H$_5$)$_2$)$_3$, Ta(NC(CH$_3$)$_2$C$_2$H$_5$)(N(CH$_3$)$_2$)$_3$, or Ta(NC(CH$_3$)$_3$)(N(CH$_3$)$_2$)$_3$, absorbs of the surface of the substrate followed by a exposure to a reduction gas such as H$_2$, NH$_3$, N$_2$ and H$_2$, N$_2$H$_4$, NH(CH$_3$)$_2$, or N$_2$H$_3$CH$_3$.

In another example of a thermally-driven vapor deposition process, such as an ALD or CVD process, for the first process shown in FIG. 5, when depositing titanium (Ti), titanium nitride, or titanium carbonitride, the Ti carrier can include TiF$_4$, TiCl$_4$, TiBr$_4$, TiI$_4$, Ti[N(C$_2$H$_5$CH$_3$)]$_4$ (TEMAT), Ti[N (CH$_3$)$_2$]$_4$ (TDMAT), or Ti[N(C$_2$H$_5$)$_2$]$_4$ (TDEAT), and the reduction gas can include H$_2$, NH$_3$, N$_2$ and H$_2$, N$_2$H$_4$, NH(CH$_3$)$_2$, or N$_2$H$_3$CH$_3$.

As another example of a thermally-driven vapor deposition process, such as an ALD or CVD process, for the first process shown in FIG. 5, when depositing tungsten (W), tungsten nitride, or tungsten carbonitride, the W carrier can include WF$_6$, or W(CO)$_6$, and the reduction gas can include H$_2$, NH$_3$, N$_2$ and H$_2$, N$_2$H$_4$, NH(CH$_3$)$_2$, or N$_2$H$_3$CH$_3$.

In another example of a thermally-driven vapor deposition process, such as an ALD or CVD process, for the first process shown in FIG. 5, when depositing molybdenum (Mo), the Mo carrier can include molybdenum hexafluoride (MoF$_6$), and the reduction gas can include H$_2$.

When depositing copper in a thermally-driven vapor deposition process, such as an ALD or CVD process, for the first process shown in FIG. 5, the Cu carrier can include Cu-containing organometallic compounds, such as Cu(TMVS) (hfac), also known by the trade name CupraSelect®, available from Schumacher, a unit of Air Products and Chemicals, Inc., 1969 Palomar Oaks Way, Carlsbad, Calif. 92009), or inorganic compounds, such as CuCl. The reduction gas can include at least one of H$_2$, O$_2$, N$_2$, NH$_3$, or H$_2$O. As used herein, the term "at least one of A, B, C, . . . or X" refers to any one of the listed elements or any combination of more than one of the listed elements.

In another example of a thermally-driven vapor deposition process, such as an ALD or CVD process, for the first process shown in FIG. 5, when depositing zirconium oxide, the Zr carrier can include Zr(NO$_3$)$_4$, or ZrCl$_4$, and the reduction gas can include H$_2$O.

When depositing hafnium oxide in a thermally-driven vapor deposition process, such as an ALD or CVD process, for the first process shown in FIG. 5, the Hf carrier can include Hf(OBu$^t$)$_4$, Hf(NO$_3$)$_4$, or HfCl$_4$, and the reduction gas can include H$_2$O. In another example, when depositing hafnium (Hf), the Hf-carrier can include HfCl$_4$, and the second process material can include H$_2$.

In still another example of a thermally-driven vapor deposition process, such as an ALD or CVD process, for the first process shown in FIG. 5, when depositing niobium (Nb), the Nb carrier can include niobium pentachloride (NbCl$_5$), and the reduction gas can include H$_2$.

In another example of a thermally-driven vapor deposition process, such as an ALD or CVD process, for the first process shown in FIG. 5, when depositing zinc (Zn), the Zn carrier can include zinc dichloride (ZnCl$_2$), and the reduction gas can include H$_2$.

In another example of a thermally-driven vapor deposition process, such as an ALD or CVD process, for the first process shown in FIG. 5, when depositing silicon oxide, the Si-carrier can include Si(OC$_2$H$_5$)$_4$, SiH$_2$Cl$_2$, SiCl$_4$, or Si(NO$_3$)$_4$, and the reduction gas can include H$_2$O or O$_2$. In another example, when depositing silicon nitride, the Si carrier can include $SiCl_4$, or $SiH_2Cl_2$, and the reduction gas can include $NH_3$, or $N_2$ and $H_2$. In another example, when depositing TiN, the Ti carrier can include titanium nitrate ($Ti(NO_3)$), and the reduction gas can include $NH_3$.

In another example of a thermally-driven vapor deposition process, such as an ALD or CVD process, for the first process shown in FIG. 5, when depositing aluminum, the Al carrier can include aluminum chloride ($Al_2Cl_6$), or trimethylaluminum ($Al(CH_3)_3$), and the reduction gas can include $H_2$. When depositing aluminum nitride, the Al carrier can include aluminum trichloride, or trimethylaluminum, and the reduction gas can include $NH_3$, or $N_2$ and $H_2$. In another example, when depositing aluminum oxide, the Al carrier can include aluminum chloride, or trimethylaluminum, and the reduction gas can include $H_2O$, or $O_2$ and $H_2$.

In another example of a thermally-driven vapor deposition process, such as an ALD or CVD process, for the first process shown in FIG. 5, when depositing GaN, the Ga carrier can include gallium nitrate ($Ga(NO_3)_3$), or trimethylgallium ($Ga(CH_3)_3$), and the reduction gas can include $NH_3$.

Figure 6:
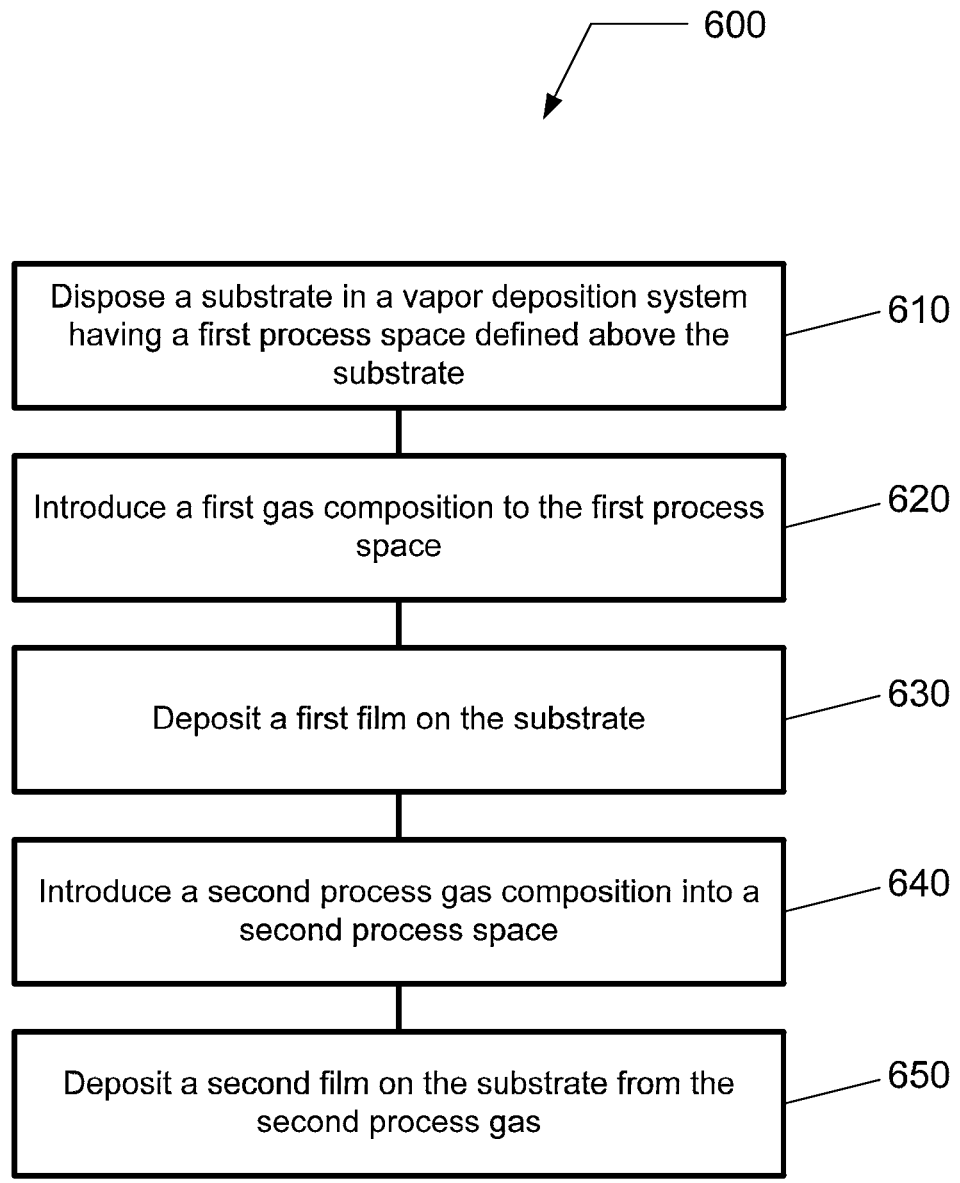
FIG. 6 shows a process flow diagram of a process in accordance with one embodiment of the invention.

In the examples given above for forming various material layers, the process material deposited for the first process shown in FIG. 6 can include at least one of a metal film, a metal nitride film, a metal carbonitride film, a metal oxide film, or a metal silicate film. Meanwhile, the process material deposited for the second deposition process can include another material film of either the same or different metal composition. For example, the process material deposited for the first process shown in FIG. 6 can include at least one of a tantalum film, a tantalum nitride film, or a tantalum carbonitride film. Meanwhile, the process material deposited for the second deposition process depicted in FIG. 5 can include for example another tantalum film, another tantalum nitride film, or another tantalum carbonitride film (e.g., a tantalum film deposited over a tantalum carbonitride film). Alternatively, for example, the process material deposited for the second deposition process depicted in FIG. 5 can include for example an Al film, or a Cu film deposited for example to metallize a via for connecting for example one metal line to another metal line or for connecting for example a metal line to source/drain contacts of a semiconductor device. The Al or Cu films can be formed with or without a plasma process using precursors for the Al and Cu as described above. Also, the process material deposited for the second deposition process depicted in FIG. 5 can include a zirconium oxide film, a hafnium oxide film, a hafnium silicate film, a silicon oxide film, a silicon nitride film, a titanium nitride film, and/or a GaN film deposited to form an insulating layer such as for example above for a metal line or a gate structure of a semiconductor device.

Further, the first deposition process in FIG. 5 need not occur by an ALD process but could according to the present invention occur using another thermal CVD process using suitable carrier gases known in the art. For example, silane and disilane could be used as silicon carriers for the deposition of silicon-based or silicon-including films. Germane could be used a germanium carrier for the deposition of germanium-based or germanium-including films. Such carriers could likewise be used during the plasma process depicted in FIG. 5. As such, the process material deposited for the first and second deposition process depicted in FIG. 5 can include a metal silicide film and/or a germanium-including film deposited for example to form a conductive gate structure for a semiconductor device.

As illustrated in FIG. 5, following the deposition of the first film, the second film is deposited preferably with a plasma process. A plasma process such as a plasma enhanced chemical vapor deposition (PECVD) process or a plasma enhanced atomic layer deposition process is preferred for the deposition of the second film due to its typically higher growth rate compared to thermal CVD or thermal ALD, respectively. However, other techniques can be used according to the present invention to deposit the second film.

Furthermore, in the above alternating process illustrated in FIG. 5, the process volume can be varied between a first volume (V1) during introduction of the first process gas material for the first time period and optionally the introduction of the purge gas for the second time period, and a second volume (V2) during the introduction of the second process gas material for the third period of time and optionally the introduction of the purge gas for the fourth period of time. An optimal volume for V1 and V2 can be selected for the process space for each process step in the PEALD process.

For example, the first volume (V1) can be sufficiently small such that the first process gas material passes through the process space and some fraction of the first process gas material adsorbs on the surface of the substrate. As the first volume of the process space is reduced, the amount of the first process gas material necessary for adsorption on the substrate surface is reduced and the time required to exchange the first process gas material within the first process space is reduced. For instance, as the first volume of the process space is reduced, the residence time is reduced, hence, permitting a reduction in the first period of time.

Moreover, for example, the second volume (V2) can be set to a volume in which the formation of plasma from the second process material leads to the formation of uniform plasma above the substrate. The ability according to the present invention to be able to provide a plasma process geometry of comparable uniformity to the thermal process geometry permits the present invention to perform consecutive thermal and plasma processes in the same system without the need to transfer the process wafer between different processing systems, thereby saving process time and reducing surface contamination at the interfaces between the process films, leading to improved material properties for the resultant films.

In one embodiment of the present invention, the second volume V2 of the process space defines a process space having an aspect ratio of height to width that is greater than 0.1 and preferably greater than 0.5. For example, as the aspect ratio decreases, the plasma uniformity has been observed to worsen, while as the aspect ratio increases, the plasma uniformity has been observed to improve.

When processing substrates including semiconductor wafers, the process space is substantially cylindrical, characterized by a diameter and a height or spacing between the substrate and the upper assembly. The diameter is related to the size of the substrate, whereas the spacing (or height) can be the variable parameter for adjusting the volume of the process space. The first volume during introduction of the first process material can, for example, include a spacing less than or equal to 20 mm from the substrate stage 20 to the upper assembly 30, and the second volume during introduction of the second process material can, for example, include a spacing greater than 20 mm.

FIG. 6 shows a process flow diagram of a process in accordance with one embodiment of the present invention. The process of FIG. 6 may be performed by the processing system of FIGS. 1-4, or any other suitable processing system. As seen in FIG. 6, in step 610, the process begins when a substrate is disposed in a vapor deposition system having a process space defined above the substrate. In step 620, a first process gas composition is introduced to the process space according to a first vapor deposition process. In step 630, a first film is deposited on the substrate. In step 640, a second process gas composition is introduced into a second process space different in size from the first process space. In step 650, a second film is deposited on the substrate from the second process gas composition.

In steps 630 and 650, the material deposited for the first and second films can be the same material or can be different materials.

In step 610, the vapor deposition system can be configured for at least one of an atomic layer deposition (ALD) process, a plasma enhanced ALD (PEALD) process, a plasma enhanced chemical vapor deposition (PECVD) process, or a thermal chemical vapor deposition (CVD) process. As such, the first film deposited can be deposited with the ALD process, and the second film can be deposited with the PEALD process. Alternatively, the first film deposited can be deposited with the thermal CVD process, and the second film can be deposited with the PECVD process. Alternatively, the first film deposited can be deposited with the ALD process, and the second film can be deposited with the thermal CVD process or the PECVD process.

In step 620, the first process gas composition is introduced in the process space above the substrate surrounded by a shield. In one embodiment of the present invention, the shield can be perforated permitting pumping of the first process gas composition through the shield. If the shield does not have perforations, the interior of the process space can be pumped separately.

In step 650, a substrate stage holding the substrate can be translated to a position that improves the uniformity of deposit of the second film. In step 650, a plasma can be formed by applying RF energy at a frequency from 0.1 to 100 MHz. In one aspect of the present invention, prior to forming the plasma, the volume of the process space is increased in order to facilitate conditions more conducive for plasma uniformity. As such, prior to step 650, the substrate stage can be translated to a position that improves plasma uniformity of the second vapor deposition process. For example, the substrate stage can be set to a position in which the plasma uniformity is better than 2% across a 200 mm diameter of the substrate stage or better than 1% across a 200 mm diameter of the substrate stage.

During step 650, a substrate bias can be provided to the substrate. For example, the substrate bias can be a DC voltage and/or a RF voltage having a frequency from 0.1 to 100 MHz. Prior to step 650, electromagnetic power can be coupled to the vapor deposition system to generate a plasma that accelerates a reduction reaction process at a surface of the first film.

Furthermore, a purge gas can be introduced after depositing the first film. Moreover, with or without the purge gas present, electromagnetic power can be coupled to the vapor deposition system to release contaminants from at least one of the vapor deposition system or the substrate. The electromagnetic power can be coupled into the vapor deposition system in the form of a plasma, an ultraviolet light, or a laser.

In one embodiment of the present invention the purge gas can be a reactive cleaning gas. In this case, the reactive cleaning gas chemically reacts with contaminants on the process chamber walls and/or the substrate surface to assist in removing such impurities from the process chamber. As would be understood by one of ordinary skill in the art, the composition of the reactive gas depends largely on the ALD process and, in particular, the contaminants to be removed from the process chamber. That is, a reactive gas is selected to react with the contaminants to be removed from the process chamber. In considering an example of depositing a tantalum film, using tantalum pentachloride as the first process material and hydrogen for the second process material (i.e., reduction reaction), chlorine contaminants may reside on the processing walls and within the deposited film itself. To remove these chlorine contaminants, ammonia ($NH_3$) can be introduced to chemically react with the chlorine contaminants and release them from the walls and/or substrate, so that the contaminants can be expelled from the chamber by vacuum pumping.

In another embodiment of the present invention, the process chamber walls may be heated in order to facilitate a chemical reaction to remove the contaminants. For example, when reducing chlorine contaminants as described above, the chamber walls are heated to at least 80° C.

As shown in FIGS. 1-4, deposition systems 1 and 1' include a controller 70 that can be coupled to processing chamber 10, substrate stage 20, upper assembly 30, first process material supply system 40, second process material supply system 42, purge gas supply system 44, first power source 50, substrate temperature control system 60, and/or process volume adjustment system 80.

The controller 70 can include a microprocessor, memory, and a digital I/O port capable of generating control voltages sufficient to communicate and activate inputs to deposition system 1 (1') as well as monitor outputs from deposition system 1 (1') in order to control and monitor the above-discussed processes for film deposition. For example, the controller 70 can include computer readable medium containing program instructions for execution to accomplish the steps described above in relation to FIG. 6. Moreover, the controller 70 may be coupled to and may exchange information with the process chamber 10, substrate stage 20, upper assembly 30, first process material gas supply system 40, second process material supply gas system 42, purge gas supply system 44, first power source 50, second power source 52, substrate temperature controller 60, and/or pressure control system 32. For example, a program stored in the memory may be utilized to activate the inputs to the aforementioned components of the deposition system 1 (1') according to a process recipe in order to perform one of the above-described non-plasma or plasma enhanced deposition processes.

One example of the controller 70 is a DELL PRECISION WORKSTATION 610™, available from Dell Corporation, Austin, Tex. However, the controller 70 may be implemented as a general-purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the deposition system 1 (1'), or it may be remotely located relative to the deposition system 1 (1'). For example, the controller 70 may exchange data with the deposition system 1 (1') using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the deposition system 1 (1') via a wireless connection.

Figure 7A:
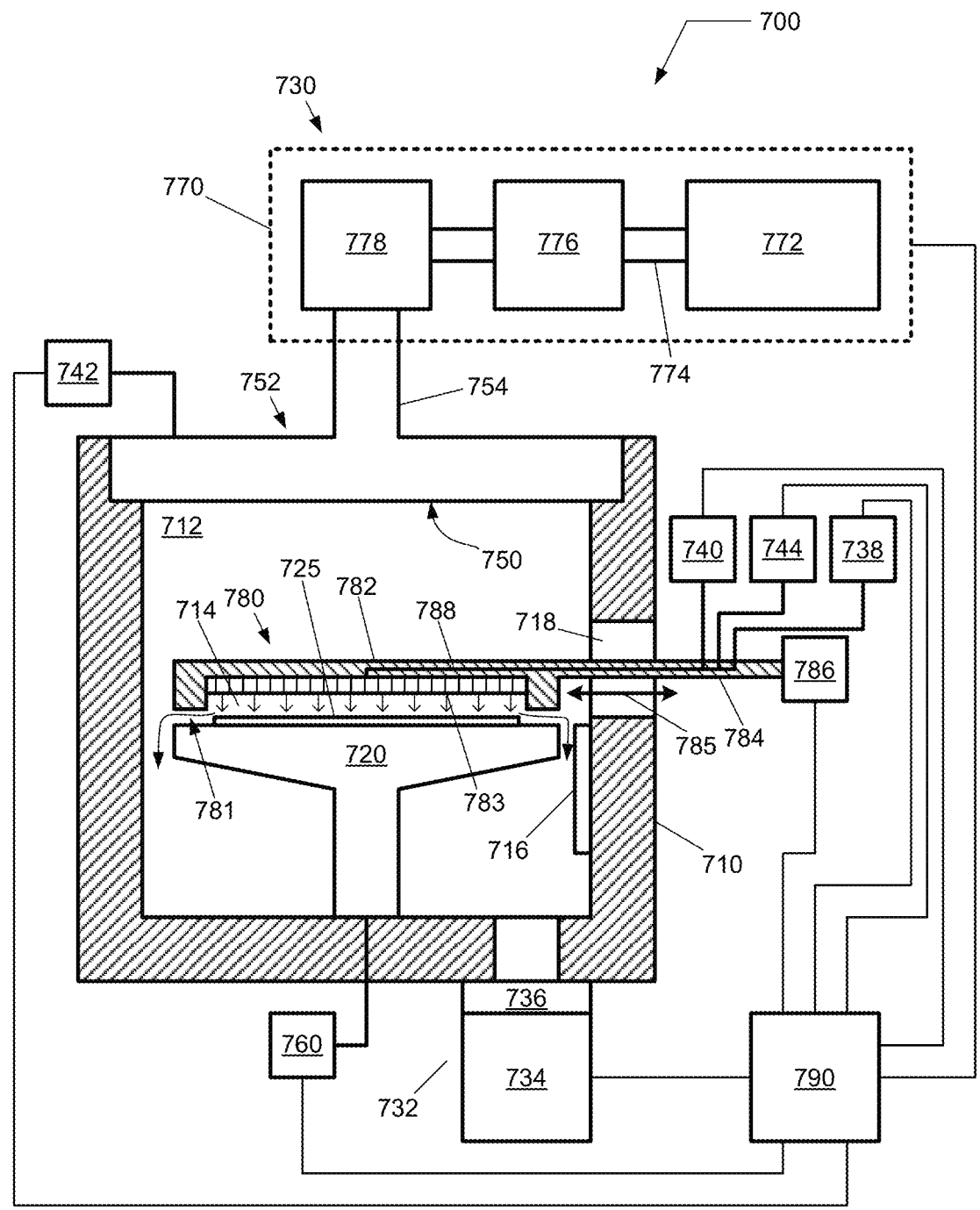
FIG. 7A depicts a schematic cross-sectional side view of a deposition system in accordance with another embodiment of the invention.
Figure 7B:
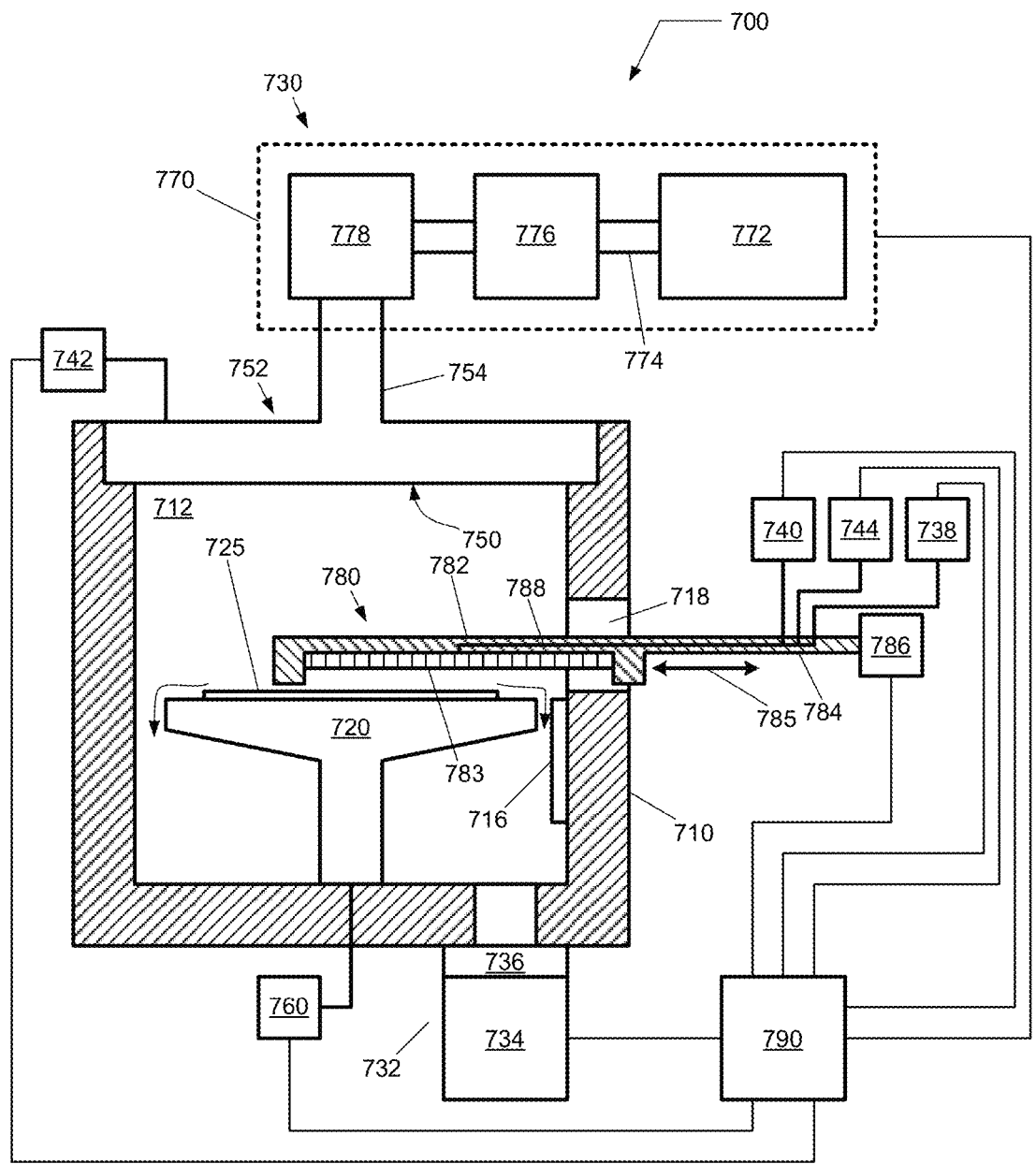
FIG. 7B depicts a schematic cross-sectional side view of the deposition system of FIG. 7A.
Figure 7C:
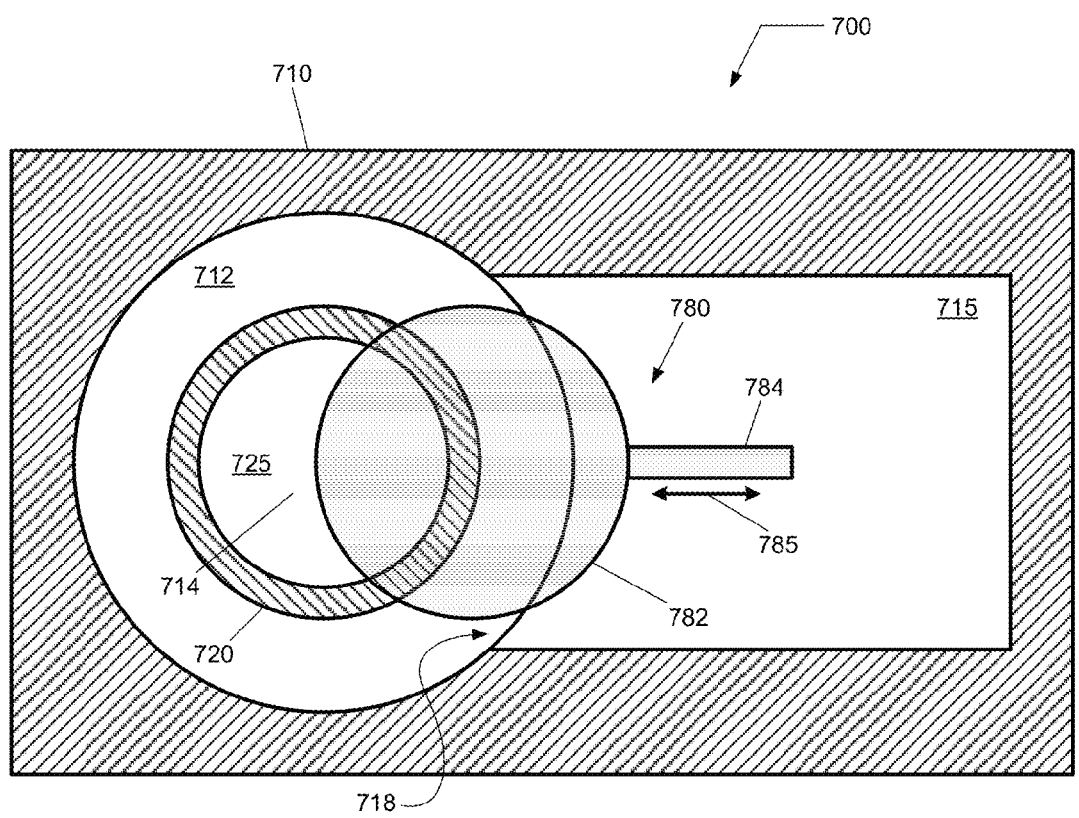
FIG. 7C depicts a schematic cross-sectional top view of the deposition system of FIG. 7A.

Referring now to FIGS. 7A through 7C, a deposition system 700 is schematically illustrated according to another embodiment. The deposition system 700 comprises a processing chamber 710 including a first process space 712 having a first volume. The processing chamber 710 further comprises a substrate stage 720 configured to support a substrate 725, upon which a thin film is to be formed, and expose the substrate 725 to the first process space 712. Additionally, the deposition system 700, as illustrated in FIGS. 7A and 7B, includes a process volume adjustment system 780 coupled to the processing chamber 710, and configured to adjust the volume of the process space to which the substrate 725 is exposed. The process volume adjustment system 780 creates a second process space 714 that includes at least a part of the first process space 712 and that has a second volume less than the first volume, wherein the substrate 725 is exposed to the second process space 714.

The deposition system 700 may be configured to process 200 mm substrates, 300 mm substrates, or larger-sized substrates. In fact, it is contemplated that the deposition systems described in the present invention may be configured to process substrates, wafers, or LCDs regardless of their size, as would be appreciated by those skilled in the art. Substrates can be introduced to processing chamber 710, and the substrate may be lifted to and from an upper surface of substrate stage 720 via a substrate lift system (not shown).

FIGS. 7A and 7B provide a schematic cross-sectional side view of deposition system 700, and FIG. 7C provides a schematic cross-sectional top view of deposition system 700. As illustrated therein, the process volume adjustment system 780 comprises a movable enclosure device 782 configured to extend into the processing chamber 710 and separate the second process space 714 from at least a portion of the first process space 712. As shown in FIG. 7A in accordance with one embodiment, the movable enclosure device 782 may partially isolate the second process space 714 from at least a portion of the first process space 712. As a result, the movable enclosure device 782 is spaced apart from the substrate stage 720 leaving a clearance gap 781 at a peripheral edge of the substrate stage 720 through which gases may pass. The size of the clearance gap 781 may be variable, yet it may be made to be less than about 10 mm (millimeters).

The movable enclosure device 782 may be coupled to a drive system 786 via an extension member 784. The drive system 786 may be configured to horizontally translate the movable enclosure device 782 into and out of the processing chamber 710. In doing so, the process volume, to which substrate 725 is exposed, may be adjusted between the first process volume and the second process volume.

As illustrated in FIG. 7A, the movable enclosure device 782 is extended into processing chamber 710 and configured to separate and partially isolate the second process space 714 from at least a portion of the first process space 712. Then, as illustrated in FIGS. 7B and 7C, the movable enclosure device 782 may be horizontally translated out of processing chamber 710 to expose the substrate 725 to the first process space 712. When the movable enclosure device 782 is horizontally translated, the movable enclosure device 782 may translate in a plane horizontal with substrate 725 along translation direction 785 that is parallel to a longitudinal axis of extension member 784 through chamber opening 718 and into a storage space 715, as shown in FIG. 7C. Following the translation of the movable enclosure device 782 into storage space 715, a shutter member 716 may close off the storage space 715.

As illustrated in FIGS. 7A and 7B, deposition system 700 can include a substrate temperature control system 760 coupled to the substrate stage 720 and configured to control the temperature of substrate 725. Substrate temperature control system 760 can include temperature control elements, such as a cooling system and/or a heating system. Additionally, temperature control elements may be disposed in the chamber walls of the processing chamber 710 and any other component within the deposition system 700.

In order to improve the thermal transfer between substrate 725 and substrate stage 720, substrate stage 720 may include a mechanical clamping system, or an electrical clamping system, such as an electrostatic clamping system, to affix substrate 725 to an upper surface of substrate stage 720. Furthermore, substrate stage 720 may further include a substrate backside gas delivery system configured to introduce gas to the backside of substrate 725 in order to improve the gas-gap thermal conductance between substrate 725 and substrate stage 720. Such a system can be utilized when temperature control of the substrate is required at elevated or reduced temperatures.

Additionally, as shown in FIG. 7A, deposition system 700 can include a pressure control system 732 including for example a vacuum pumping system 734 and a valve 736 that is coupled to the processing chamber 710 through a pumping duct. The pressure control system 732 is configured to controllably evacuate the first process space 712 and/or the second process space 714 in the processing chamber 710 to a pressure suitable for forming the thin film on substrate 725, and suitable for use of the first and/or second process materials.

Furthermore, a first process material gas supply system 740 coupled to the process volume adjustment system 780 may be configured to introduce a first process material through a gas supply line 788 to the second process space 714. A second process material gas supply system 742 coupled to the processing chamber 710 and/or the plasma source 730 may be configured to introduce a second process material to the first process space 712. Optionally, a purge gas supply system 744 may be coupled to the processing chamber 710 and/or the process volume adjustment system 780, and may be configured to introduce a purge gas to the first process space 712 and/or the second process space 714.

Optionally, a second pressure control system 738 may be coupled to the processing chamber 710 and/or the process volume adjustment system 780, and may be configured to evacuate excess and/or residual process gas from the first process space 712 and/or the second process space 714. As shown in FIG. 7A, the second pressure control system 738 may access the second process space 714 via a pumping duct arranged within the process volume adjustment system 780.

The first process material gas supply system 740 and the second process material gas supply system 742 may be configured to sequentially and, optionally, alternatingly introduce a first process material to processing chamber 710 and a second process material to processing chamber 710 and, thus, sequentially and, optionally, alternatingly adsorb a film precursor on an exposed surface of substrate 725 and chemically react the film precursor with one or more plasma constituents to form a thin film of a desired material composition. The alternation of the introduction of the first process material and the introduction of the second process material may be cyclical, or it may be acyclical with variable time periods between introduction of the first and second process materials. Alternatively, the introduction of the first process material and/or the introduction of the second process material may be continuous.

The first process material gas supply system 740, the second process material gas supply system 742, and the optional purge gas supply system 744 can include one or more material sources, one or more pressure control devices, one or more flow control devices, one or more filters, one or more valves, or one or more flow sensors. The flow control devices can include pneumatic driven valves, electro-mechanical (e.g., solenoid) valves, and/or high-rate pulsed gas injection valves.

The first process material may, for example, include a gaseous film precursor, such as a composition having the principal atomic or molecular species found in the thin film formed on substrate 725. The gaseous film precursor can originate as a solid phase, a liquid phase, or a gaseous phase, and may be delivered to processing chamber 710 in a gaseous phase. The second process material may, for example, include a reduction gas, an oxidizing gas, and/or a plasma excitation gas, such as an inert gas or noble gas (i.e., He, Ne, Ar, Kr, Xe).

For instance, the reduction gas and/or oxidizing gas may originate as a solid phase, a liquid phase, or a gaseous phase, and may be delivered to processing chamber 710 in a gaseous phase.

For example, as illustrated in FIG. 7A, when the movable enclosure device 782 is extended into the processing chamber 710 such that the movable enclosure device 782 separates and partially isolates the second process space 714 from the first process space 712, the substrate 725 may be exposed to the introduction of the first process material, such as a film precursor, in the second process space 714 to adsorb film precursor on the exposed surface of substrate 725. Excess film precursor may pass through the clearance gap 781 at the peripheral edge of the substrate stage 720 under a pressure gradient established between the second process space 714 and the first process space 712, and exhaust to the first pressure control system 732.

Thereafter, as illustrated in FIG. 7B, when the movable enclosure device 782 is translated out of the processing chamber 710 such that the substrate 725 is exposed to the first process space 712, the substrate 725 may be exposed to plasma formed with the introduction of the second process material in the first process space 712 to react with the adsorbed film precursor and form the desired thin film on the exposed surface of substrate 725. As the movable enclosure device 782 is translated out of the processing chamber 710, residual film precursor may be purged and evacuated from the former second process space 714 to the first pressure control system 732.

Among other things, the reduction of volume from the first volume associated with the first process space 712 to the second volume associated with the second process space 714 may reduce or minimize the time for proper adsorption of the first process material, or film precursor, on the exposed surface of substrate 725, and/or reduce or minimize the amount of the first process material, or film precursor, consumed during the adsorption process. Furthermore, among other things, the separation and partial isolation of the second process space 714 from the first process space 712 may reduce or minimize contamination of the interior surfaces of processing chamber 710 by the first process material, or film precursor.

Referring still to FIG. 7A, deposition system 700 can include an upper chamber assembly coupled to the processing chamber 710. The upper chamber assembly includes a plasma source 730 configured to generate plasma in the first process space 712. The plasma source 730 may include a capacitively coupled plasma (CCP) source, an inductively coupled plasma (ICP) source, a helicon wave plasma source, an electron cyclotron resonance (ECR) plasma source, or a surface wave plasma source, or any combination of two or more thereof.

Further yet, deposition system 700 may include a controller 790 that can be coupled to processing chamber 710, substrate stage 720, plasma source 730, first process material supply system 740, second process material supply system 742, purge gas supply system 744, substrate temperature control system 760, pressure control system 732, second pressure control system 738, and/or process volume adjustment system 780.

Figure 8A:
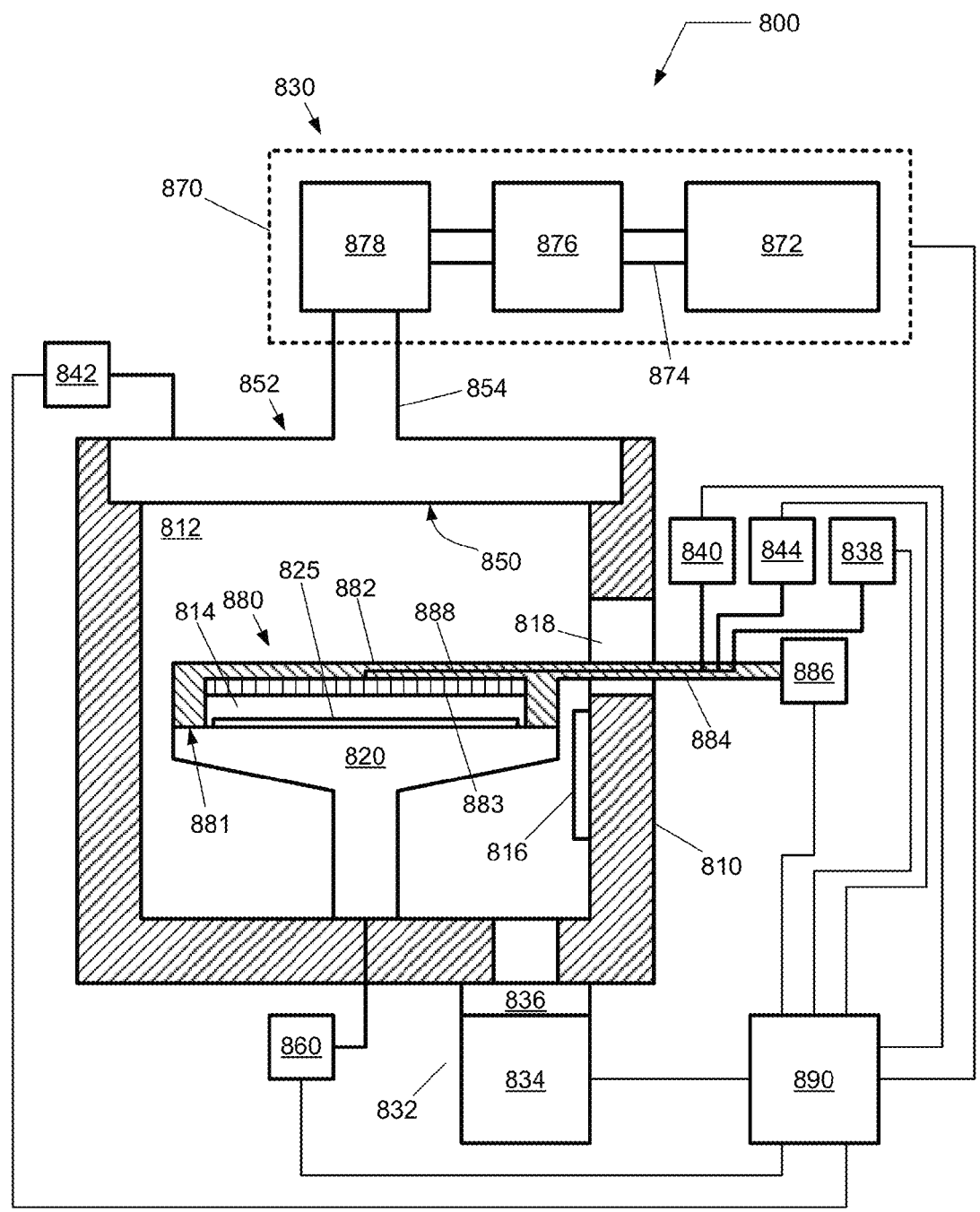
FIG. 8A depicts a schematic cross-sectional side view of a deposition system in accordance with another embodiment of the invention.
Figure 8B:
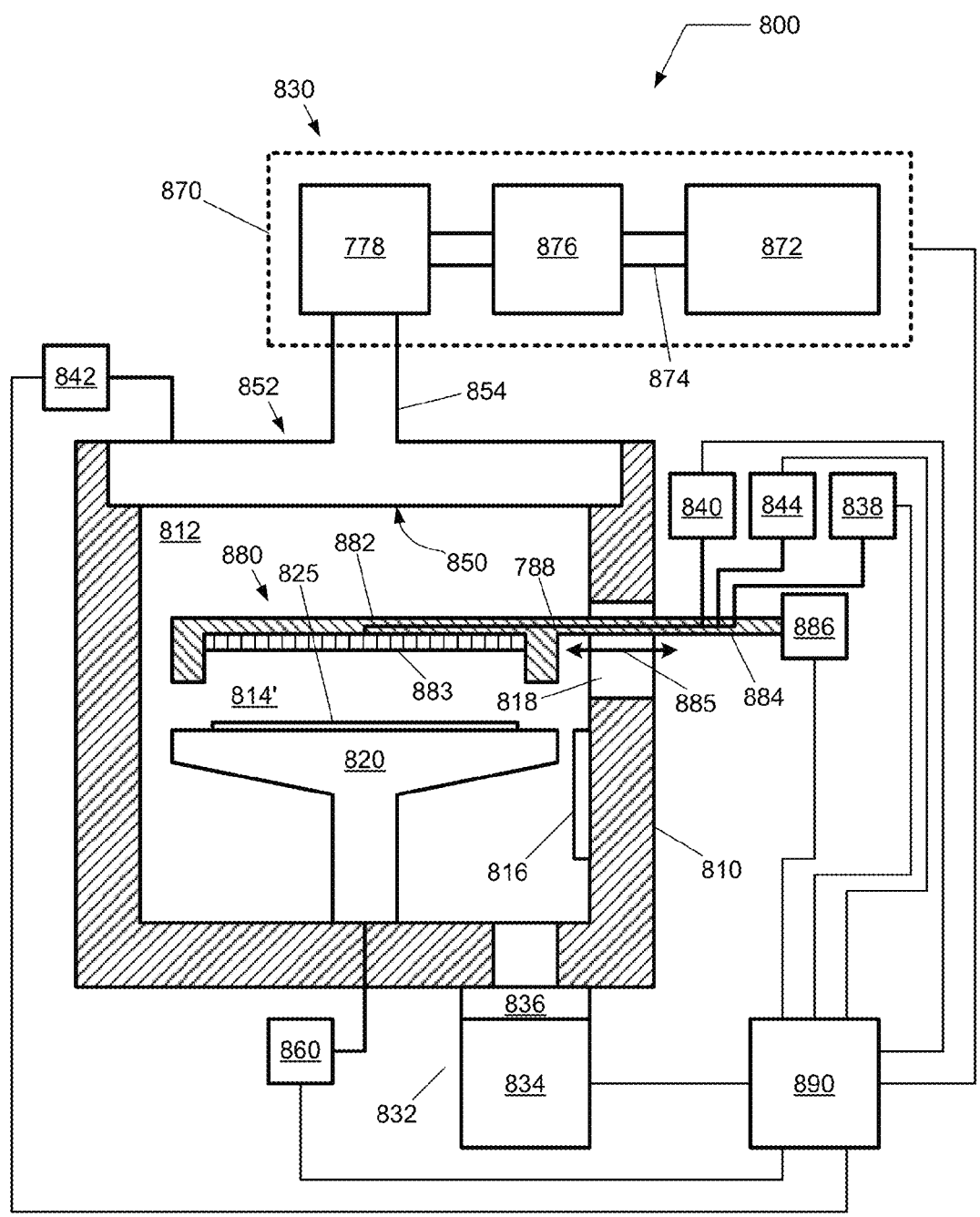
FIG. 8B depicts a schematic cross-sectional side view of the deposition system of FIG. 8A.
Figure 8C:
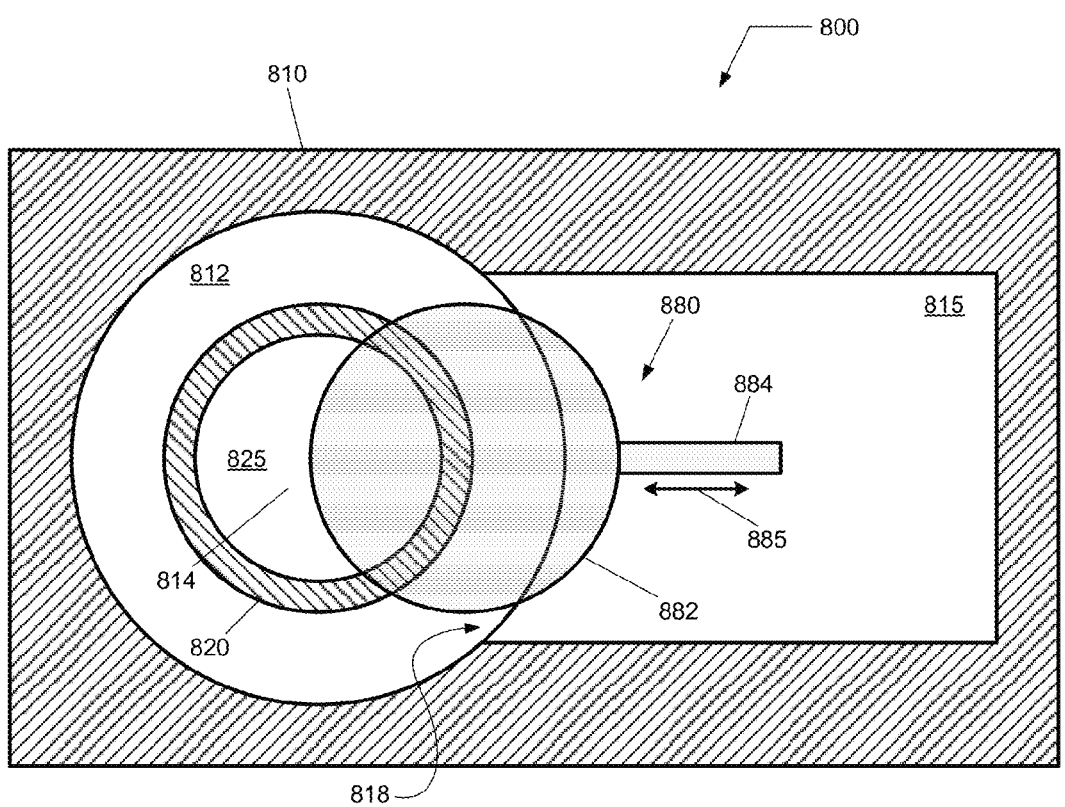
FIG. 8C depicts a schematic cross-sectional top view of the deposition system of FIG. 8A.

Referring now to FIGS. 8A through 8C, a deposition system 800 is schematically illustrated according to another embodiment. The deposition system 800 comprises a processing chamber 810 including a first process space 812 having a first volume. The processing chamber 810 further comprises a substrate stage 820 configured to support a substrate 825, upon which a thin film is to be formed, and expose the substrate 825 to the first process space 812. Additionally, the deposition system 800, as illustrated in FIGS. 8A and 8B, includes a process volume adjustment system 880 coupled to the processing chamber 810, and configured to adjust the volume of the process space to which the substrate 825 is exposed. The process volume adjustment system 880 creates a second process space 814 that includes at least a part of the first process space 812 and that has a second volume less than the first volume, wherein the substrate 825 is exposed to the second process space 814.

The deposition system 800 may be configured to process 200 mm substrates, 300 mm substrates, or larger-sized substrates. In fact, it is contemplated that the deposition systems described in the present invention may be configured to process substrates, wafers, or LCDs regardless of their size, as would be appreciated by those skilled in the art. Substrates can be introduced to processing chamber 810, and the substrate may be lifted to and from an upper surface of substrate stage 820 via a substrate lift system (not shown).

FIGS. 8A and 8B provide a schematic cross-sectional side view of deposition system 800, and FIG. 8C provides a schematic cross-sectional top view of deposition system 800. As illustrated therein, the process volume adjustment system 880 comprises a movable enclosure device 882 configured to extend into the processing chamber 810 and separate the second process space 814 from at least a portion of the first process space 812. As shown in FIG. 8A, the movable enclosure device 882 may substantially isolate or fully isolate the second process space 814 from at least a portion of the first process space 812. Furthermore, the movable enclosure device 882 may contact the substrate stage 820. For example, the movable enclosure device 882 may partially contact or fully contact a peripheral edge 881 of the substrate stage 820. Additionally, for example, the movable enclosure device 882 may or may not (vacuum) seal with the peripheral edge 881 of substrate stage 820. Furthermore, for example, the movable enclosure device 882 may not contact the peripheral edge 881, yet it may be spaced in close proximity to the peripheral edge, e.g., within at or about 1 mm, or within a thickness of substrate 825.

The movable enclosure device 882 may be coupled to a drive system 886 via an extension member 884. The drive system 886 may be configured to vertically translate the movable enclosure device 882 to and from the peripheral edge 881 of the substrate stage 820, as well as horizontally translate the movable enclosure device 882 into and out of the processing chamber 810. In doing so, the process volume, to which substrate 825 is exposed, may be adjusted between the first process volume and the second process volume.

As illustrated in FIG. 8A, the movable enclosure device 882 is extended into processing chamber 810 and configured to separate and isolate the second process space 814 from at least a portion of the first process space 812. Then, as illustrated in FIGS. 8B and 8C, the movable enclosure device 882 may be vertically elevated above the substrate stage 820 in the processing chamber 810 and horizontally translated out of the processing chamber 810 to expose the substrate 825 to the first process space 812. When vertically elevated above the substrate stage 820 in the processing chamber 810, the movable enclosure device 882 may translate in a plane horizontal with substrate 825 along translation direction 885 that is parallel to a longitudinal axis of extension member 884 through chamber opening 818 and into a storage space 815, as shown in FIG. 8C. Following the translation of the movable enclosure device 882 into storage space 815, a shutter member 816 may close off the storage space 815.

As illustrated in FIGS. 8A and 8B, deposition system 800 can include a substrate temperature control system 860 coupled to the substrate stage 820 and configured to control the temperature of substrate 825. Substrate temperature control system 860 can include temperature control elements, such as a cooling system and/or a heating system. Additionally, temperature control elements may be disposed in the chamber walls of the processing chamber 810 and any other component within the deposition system 800.

In order to improve the thermal transfer between substrate 825 and substrate stage 820, substrate stage 820 may include a mechanical clamping system, or an electrical clamping system, such as an electrostatic clamping system, to affix substrate 825 to an upper surface of substrate stage 820. Furthermore, substrate stage 820 may further include a substrate backside gas delivery system configured to introduce gas to the backside of substrate 825 in order to improve the gas-gap thermal conductance between substrate 825 and substrate stage 820. Such a system can be utilized when temperature control of the substrate is required at elevated or reduced temperatures. For example, the substrate backside gas system can include a two-zone gas distribution system, wherein the gas gap pressure can be independently varied between the center and the edge of substrate 825.

Additionally, as shown in FIG. 8A, deposition system 800 can include a pressure control system 832 including for example a vacuum pumping system 834 and a valve 836 that is coupled to the processing chamber 810 through a pumping duct. The pressure control system 832 is configured to controllably evacuate the first process space 812 and/or the second process space 814 in the processing chamber 810 to a pressure suitable for forming the thin film on substrate 825, and suitable for use of the first and/or second process materials.

Furthermore, a first process material gas supply system 840 coupled to the process volume adjustment system 880 may be configured to introduce a first process material through a gas supply line 888 to the second process space 814. A second process material gas supply system 842 coupled to the processing chamber 810 and/or the plasma source 830 may be configured to introduce a second process material to the first process space 812. Optionally, a purge gas supply system 844 may be coupled to the processing chamber 810 and/or the process volume adjustment system 880, and may be configured to introduce a purge gas to the first process space 812 and/or the second process space 814. Optionally, a second pressure control system 838 may be coupled to the processing chamber 810 and/or the process volume adjustment system 880, and may be configured to evacuate excess and/or residual process gas from the first process space 812 and/or the second process space 814. As shown in FIG. 8A, the second pressure control system 838 may access the second process space 814 via a pumping duct arranged within the process volume adjustment system 880.

The first process material gas supply system 840 and the second process material gas supply system 842 may be configured to sequentially and, optionally, alternatingly introduce a first process material to processing chamber 810 and a second process material to processing chamber 810 and, thus, sequentially and, optionally, alternatingly adsorb a film precursor on a surface of substrate 825 and chemically react the film precursor with one or more plasma constituents to form a thin film of a desired material composition. The alternation of the introduction of the first process material and the introduction of the second process material may be cyclical, or it may be acyclical with variable time periods between introduction of the first and second process materials. Alternatively, the introduction of the first process material and/or the introduction of the second process material may be continuous.

The first process material gas supply system 840, the second process material gas supply system 842, and the optional purge gas supply system (not shown) can include one or more material sources, one or more pressure control devices, one or more flow control devices, one or more filters, one or more valves, or one or more flow sensors. The flow control devices can include pneumatic driven valves, electro-mechanical (e.g., solenoid) valves, and/or high-rate pulsed gas injection valves.

The first process material may, for example, include a gaseous film precursor, such as a composition having the principal atomic or molecular species found in the thin film formed on substrate 825. The gaseous film precursor can originate as a solid phase, a liquid phase, or a gaseous phase, and may be delivered to processing chamber 810 in a gaseous phase. The second process material may, for example, include a reduction gas, an oxidizing gas, and/or a plasma excitation gas, such as an inert gas or noble gas (i.e., He, Ne, Ar, Kr, Xe). For instance, the reduction gas and/or oxidizing gas may originate as a solid phase, a liquid phase, or a gaseous phase, and may be delivered to processing chamber 810 in a gaseous phase.

For example, as illustrated in FIG. 8A, when the movable enclosure device 882 is extended into the processing chamber 810 such that the movable enclosure device 882 separates and isolates the second process space 814 from the first process space 812, the substrate 825 may be exposed to the introduction of the first process material, such as a film precursor, in the second process space 814 to adsorb film precursor on the exposed surface of substrate 825. Excess film precursor may exhaust to the first pressure control system 832, or the second pressure control system 838 through the movable enclosure device 882.

Thereafter, as illustrated in FIG. 8B, when the movable enclosure device 882 is translated out of the processing chamber 810 such that the substrate 825 is exposed to the first process space 812, the substrate 825 may be exposed to plasma formed with the introduction of the second process material in the first process space 812 to react with the adsorbed film precursor and form the desired thin film on the exposed surface of substrate 825. Prior to translating the movable enclosure device 882 out of the processing chamber 810, residual film precursor may be purged and evacuated from the second process space 814 by the first pressure control system 832 or the second pressure control system 838. Alternatively, as the movable enclosure device 882 is translated out of the processing chamber 810, residual film precursor may be purged and evacuated from the former second process space 814 by the first pressure control system 832 or the second pressure control system 838.

Among other things, the reduction of volume from the first volume associated with the first process space 812 to the second volume associated with the second process space 814 may reduce or minimize the time for proper adsorption of the first process gas material, or film precursor, on the exposed surface of substrate 825, and/or reduce or minimize the amount of the first process gas material, or film precursor, consumed during the adsorption process. Furthermore, among other things, the separation and partial isolation of the second process space 814 from the first process space 812 may reduce or minimize contamination of the interior surfaces of processing chamber 810 by the first process gas material, or film precursor.

Referring still to FIG. 8A, deposition system 800 can include an upper chamber assembly coupled to the processing chamber 810. The upper chamber assembly includes a plasma source 830 configured to generate plasma in the first process space 812. The plasma source 830 may include a capacitively coupled plasma (CCP) source, an inductively coupled plasma (ICP) source, a helicon wave plasma source, an electron cyclotron resonance (ECR) plasma source, or a surface wave plasma source, or any combination of two or more thereof.

Further yet, deposition system 800 may include a controller 890 that can be coupled to processing chamber 810, substrate stage 820, plasma source 830, first process material supply system 840, second process material supply system 842, purge gas supply system 844, substrate temperature control system 860, pressure control system 832, second pressure control system 838, and/or process volume adjustment system 880.

Figure 9:
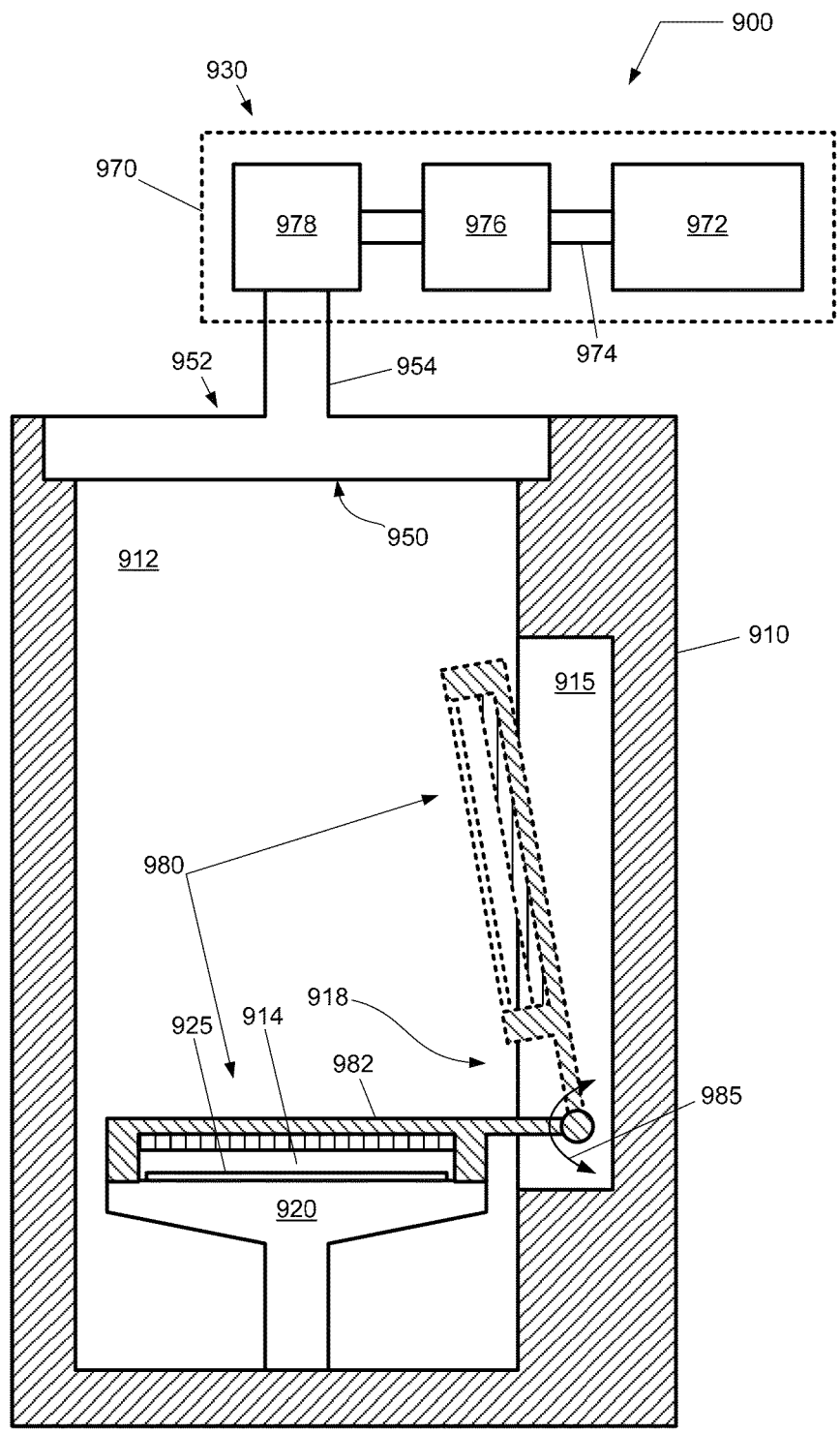
FIG. 9 depicts a schematic cross-sectional side view of a deposition system in accordance with another embodiment of the invention.

Referring now to FIG. 9, a deposition system 900 is schematically illustrated according to another embodiment. The deposition system 900 comprises a processing chamber 910, a substrate stage 920 disposed within the processing chamber 910 and configured to support a substrate 925, and a process volume adjustment system 980. The process volume adjustment system 980 comprises a movable enclosure device 982 that may extend into processing chamber 910 and separate and/or isolate a second process space 914 from at least a portion of a first process space 912. The movable enclosure device 982 may be configured to rotate about an axis parallel with substrate 925 along rotation direction 985. In a first position, the movable enclosure device 982 separates and/or isolates the second process space 914 from at least a portion of the first process space 912, thus, exposing substrate 925 to only the second process space 914. In a second position, the movable enclosure device 982 rotates through chamber opening 918 into a storage space 915, and exposes substrate 925 to the first process space 912. The movable enclosure device 982 may or may not contact the substrate stage 920.

Referring still to FIG. 9, deposition system 900 can include an upper chamber assembly coupled to the processing chamber 910. The upper chamber assembly includes a plasma source 930 configured to generate plasma in the first process space 912. The plasma source 930 may include a capacitively coupled plasma (CCP) source, an inductively coupled plasma (ICP) source, a helicon wave plasma source, an electron cyclotron resonance (ECR) plasma source, or a surface wave plasma source, or any combination of two or more thereof.

Figure 10:
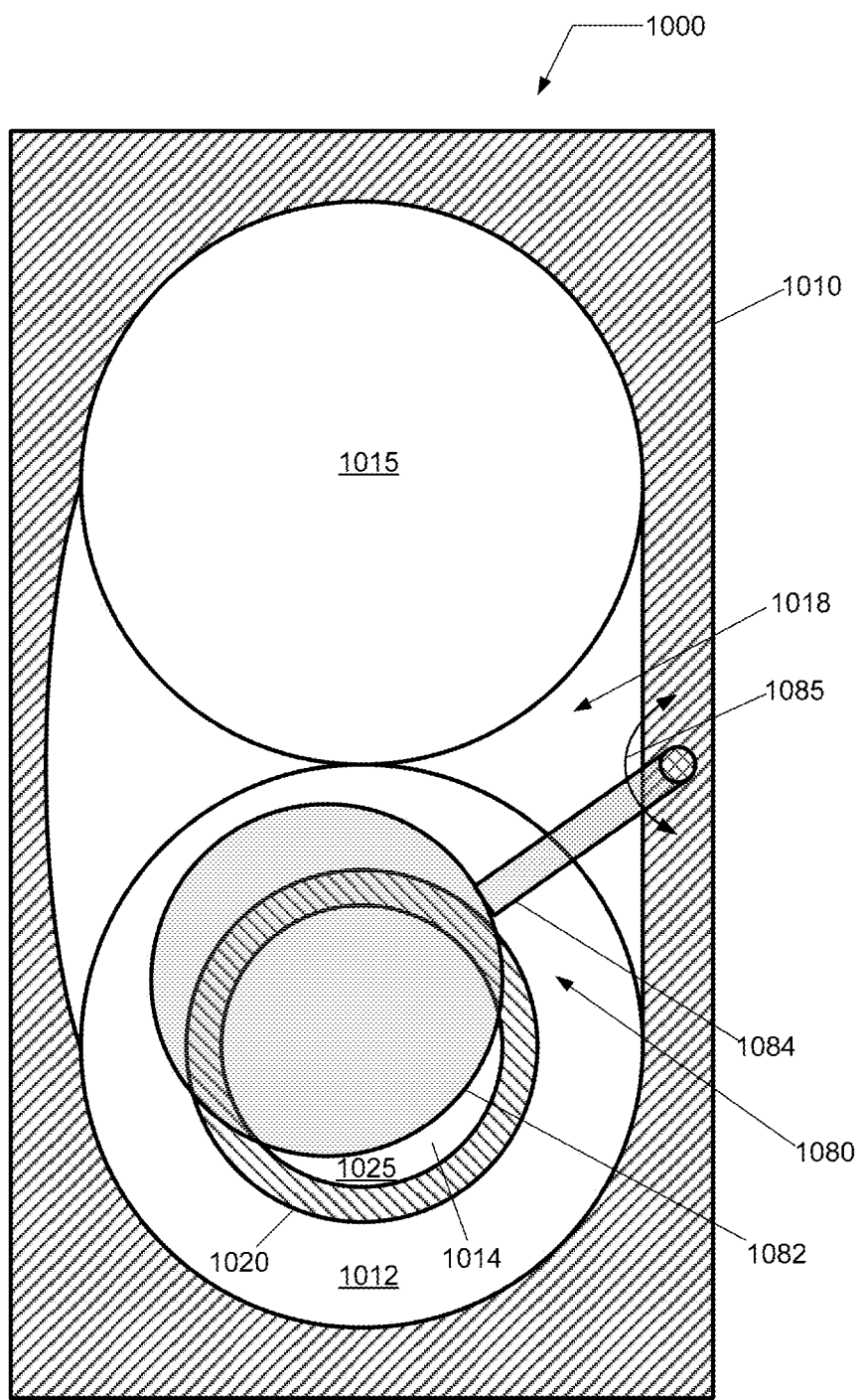
FIG. 10 depicts a schematic cross-sectional top view of a deposition system in accordance with another embodiment of the invention.

Referring now to FIG. 10, a deposition system 1000 is schematically illustrated according to another embodiment. The deposition system 1000 comprises a processing chamber 1010, a substrate stage 1020 disposed within the processing chamber 1010 and configured to support a substrate 1025, and a process volume adjustment system 1080. The process volume adjustment system 1080 comprises a movable enclosure device 1082 and an extension member 1084 that may extend into processing chamber 1010 and separate and/or isolate a second process space 1014 from at least a portion of a first process space 1012. Therein, substrate 1025 set atop substrate stage 1020 may be independently exposed to a first volume in the first process space 1012 and a second volume in the second process space 1014. The movable enclosure device 1082 is configured to rotate about an axis perpendicular to substrate 1025 along rotation direction 1085, and may or may not be configured to vertically translate to and from an upper surface of the substrate stage 1020. In a first position, the movable enclosure device 1082 separates and/or isolates the second process space 1014 from at least a portion of the first process space 1012, thus, exposing substrate 1025 to only the second process space 1014. In a second position, the movable enclosure device 1082 rotates through chamber opening 1018 into a storage space 1015, and exposes substrate 1025 to the first process space 1012. The movable enclosure device 1082 may or may not contact the substrate stage 1020.

Figure 11:
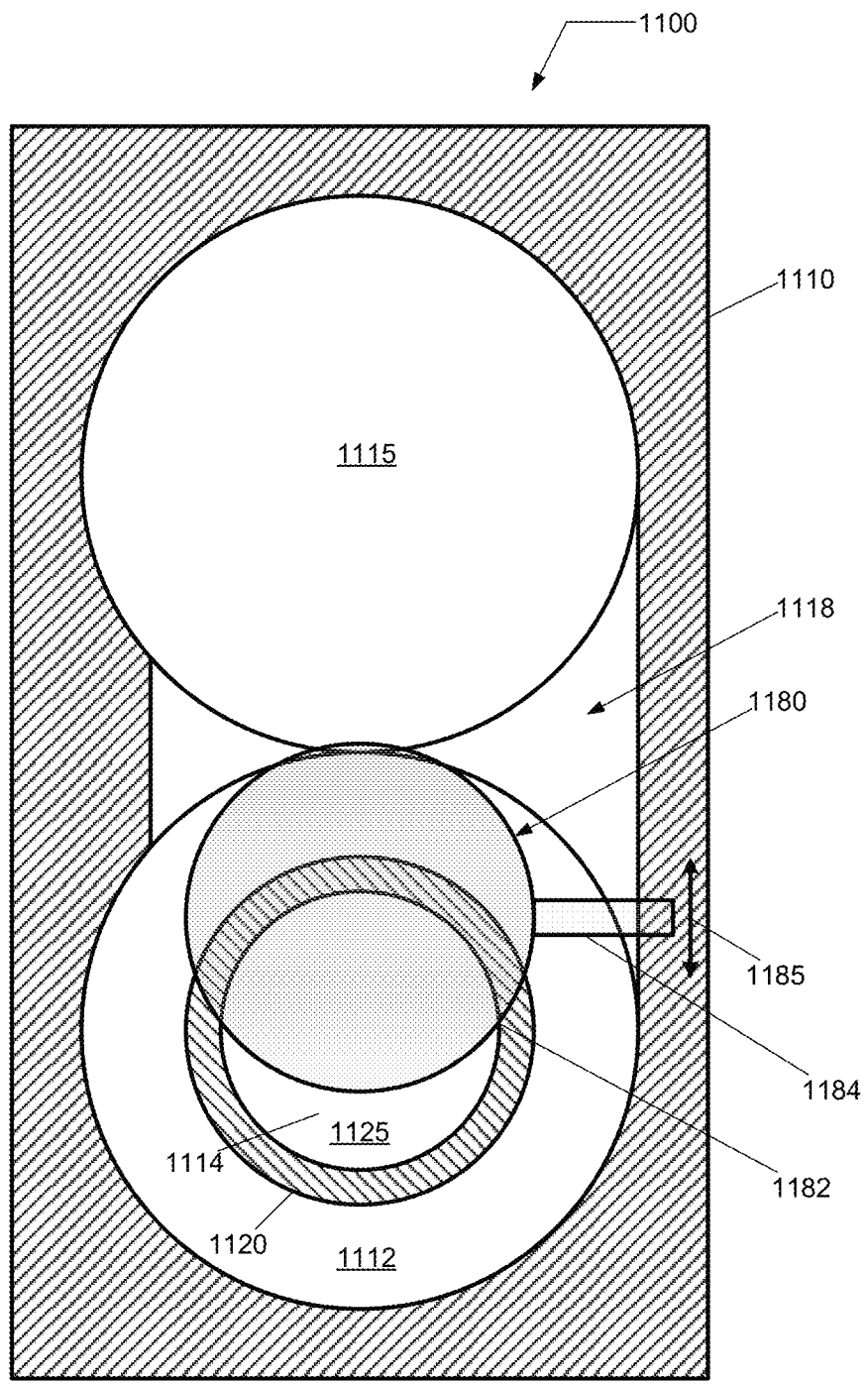
FIG. 11 depicts a schematic cross-sectional top view of a deposition system in accordance with yet another embodiment of the invention.

Referring now to FIG. 11, a deposition system 1100 is schematically illustrated according to another embodiment. The deposition system 1100 comprises a processing chamber 1110, a substrate stage 1120 disposed within the processing chamber 1110 and configured to support a substrate 1125, and a process volume adjustment system 1180. The process volume adjustment system 1180 comprises a movable enclosure device 1182 and an extension member 1184 that may extend into processing chamber 1110 and separate and/or isolate a second process space 1114 from at least a portion of a first process space 1112. Therein, substrate 1125 set atop substrate stage 1120 may be independently exposed to a first volume in the first process space 1112 and a second volume in the second process space 1114. The movable enclosure device 1182 is configured to laterally translate in a plane horizontal with substrate 1125 along a translation direction 1185, and may or may not be configured to vertically translate to and from an upper surface of the substrate stage 1120. In a first position, the movable enclosure device 1182 separates and/or isolates the second process space 1114 from at least a portion of the first process space 1112, thus, exposing substrate 1125 to only the second process space 1114. In a second position, the movable enclosure device 1182 laterally translates through chamber opening 1118 into a storage space 1115, and exposes substrate 1125 to the first process space 1112. The movable enclosure device 1182 may or may not contact the substrate stage 1120.

Various combinations of the translational and rotational degrees of freedom depicted in FIGS. 7A, 7B, 7C, 8A, 8B, 8C, 9, 10, and 11 may be used. For example, the lateral translational degree of freedom depicted in FIG. 11 (i.e., translation direction 1185) may be combined with the rotational degree of freedom depicted in FIG. 10 (i.e., rotation direction 1085) to reduce and/or optimize the footprint of the deposition system, among other things.

Referring again to FIGS. 7A and 8A, the process volume adjustment system (780, 880) may further comprise a process gas manifold (783, 883) configured to introduce process gas and/or evacuate process gas from the second process space (714, 814). For example, the process gas manifold (783, 883) may be configured to introduce the first process material and evacuate excess and/or residual first process material to and from the second process space (714, 814) via an arrangement of gas supply and gas evacuation conduits arranged in the movable enclosure device (782, 882). The arrangement of gas supply and gas evacuation conduits may extend through the extension member (784, 884) to the first process material supply system (740, 840) and second pressure control system (838), respectively.

Figures 12A, 12B:
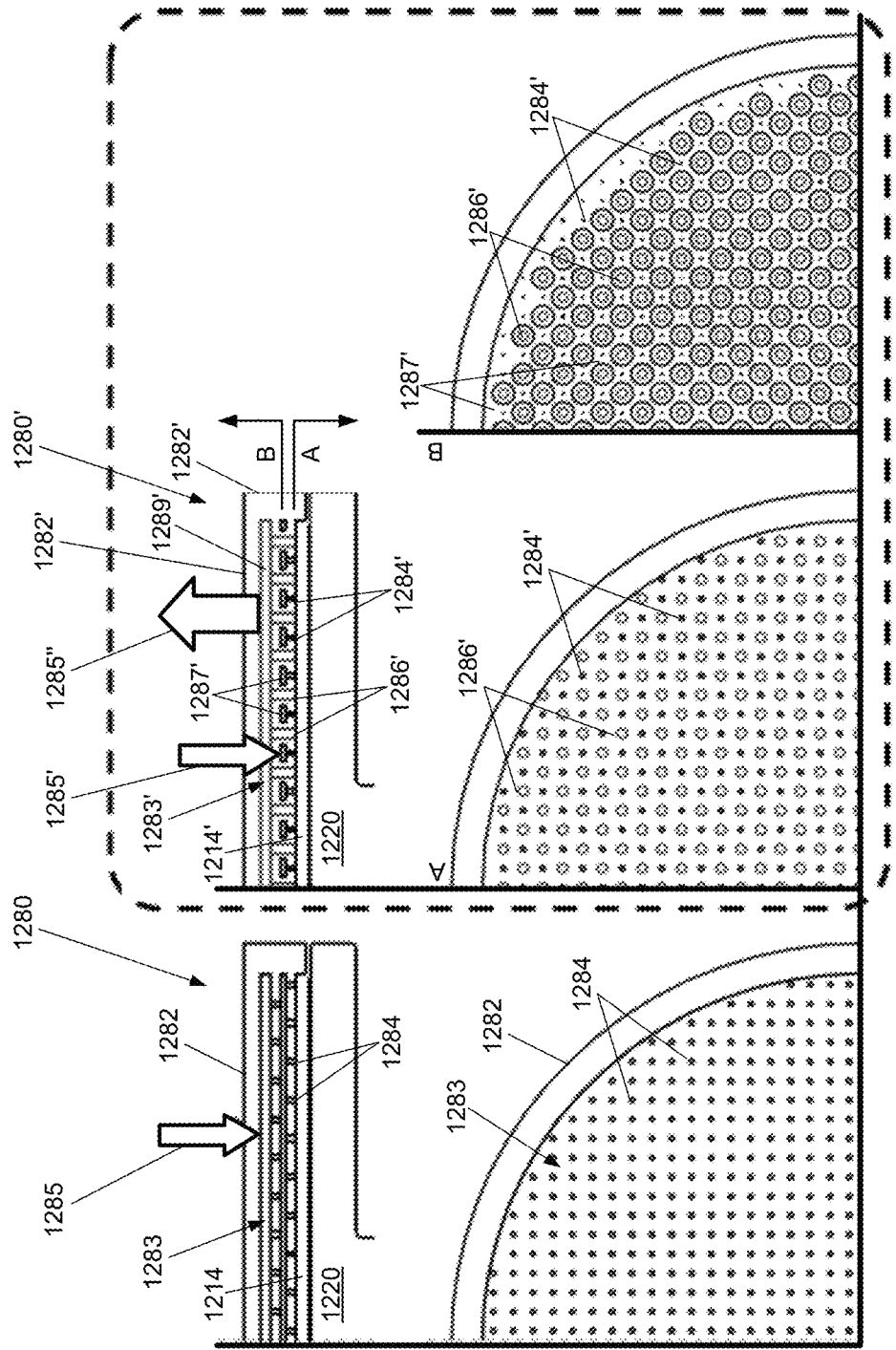
FIG. 12A depicts a cross-sectional view and corresponding partial bottom view of a process volume adjustment system in accordance with one embodiment of the invention.
FIG. 12B depicts a cross-sectional view and corresponding partial bottom view of a process volume adjustment system in accordance with another embodiment of the invention.

In accordance with one embodiment, FIG. 12A illustrates a side cross-sectional view and bottom view of a quadrant of a process volume adjustment system 1280 having a movable enclosure device 1282 and a process gas manifold 1283. The process gas manifold 1283 is configured to introduce a flow of process gas 1285, such as the first process material, to a second process space 1214 located between the movable enclosure device 1282 and a substrate stage 1220. The process gas manifold 1283 may include a distribution member having a plurality of gas distribution openings 1284 for introducing the flow of process gas 1285 to the second process space 1214. Additionally, the process gas manifold 1283 may include one or more baffle members to distribute the flow of process gas 1285 behind the distribution member having the plurality of gas distribution openings 1284.

In accordance with another embodiment, FIG. 12B illustrates a side cross-sectional view, a bottom view at plane "A", and a bottom cross-sectional view at plane "B" of a quadrant of a process volume adjustment system 1280' having a movable enclosure device 1282' and a process gas manifold 1283'. The process gas manifold 1283' is configured to introduce a flow of process gas 1285', such as the first process material, and evacuate an exhaust flow of excess and/or residual process gas 1285" to and from a second process space 1214', respectively, located between the movable enclosure device 1282' and a substrate stage 1220. The process gas manifold 1283' may include a distribution and evacuation member having a plurality of gas distribution openings 1284' for introducing the flow of process gas 1285' to the second process space 1214', and a plurality of gas evacuation openings 1286' for evacuating the exhaust flow of excess and/or residual process gas 1285" from the second process space 1214'. As shown in FIG. 12B, the plurality of gas distribution openings 1284' and the plurality of gas evacuation openings 1286' are integrated together within the process gas manifold such that these openings and the corresponding inlet and outlet flows are interspersed in the distribution and evacuation member. The process gas manifold 1283' includes a first plenum 1287' configured to supply the plurality of gas distribution openings 1284' with process gas, and an independent, second plenum 1289' configured to receive the exhaust flow of process gas through the plurality of evacuation openings 1286'.

Referring again to FIGS. 7A, 8A, and 9, a schematic representation of plasma source (730, 830, 930) is provided. According to one embodiment, plasma source (730, 830, 930) may include a surface wave plasma (SWP) source. The plasma source (730, 830, 930) may comprise an electromagnetic (EM) wave launcher (752, 852, 952) configured to couple EM energy in a desired EM wave mode to a plasma by generating a surface wave on a plasma surface (750, 850, 950) of the EM wave launcher (752, 852, 952) adjacent plasma. Furthermore, the plasma source (730, 830, 930) comprises a power coupling system (770, 870, 970) coupled to the EM wave launcher (752, 852, 952), and configured to provide the EM energy to the EM wave launcher (752, 852, 952) for forming the plasma in the first process space (712, 812, 912).

The EM wave launcher (752, 852, 952) includes a microwave launcher configured to radiate microwave power into the first process space (712, 812, 912). The EM wave launcher (752, 852, 952) is coupled to the power coupling system (770, 870, 970) via coaxial feed (754, 854, 954) through which microwave energy is transferred. The power coupling system (770, 870, 970) includes a microwave source (772, 872, 972), such as a 2.45 GHz microwave power source. Microwave energy generated by the microwave source (772, 872, 972) is guided through a waveguide (774, 874, 974) to an isolator (776, 876, 976) for absorbing microwave energy reflected back to the microwave source (772, 872, 972). Thereafter, the microwave energy is converted to a coaxial TEM (transverse electromagnetic) mode via a coaxial converter (778, 878, 978). A tuner may be employed for impedance matching, and improved power transfer. The microwave energy is coupled to the EM wave launcher (752, 852, 952) via the coaxial feed (754, 854, 954), wherein another mode change occurs from the TEM mode in the coaxial feed (754, 854, 954) to a TM (transverse magnetic) mode. Additional details regarding the design of the coaxial feed (754, 854, 954) and the EM wave launcher (752, 852, 952) can be found in U.S. Pat. No. 5,024,716, entitled "Plasma processing apparatus for etching, ashing, and film-formation"; the content of which is herein incorporated by reference in its entirety.

Figure 13A:
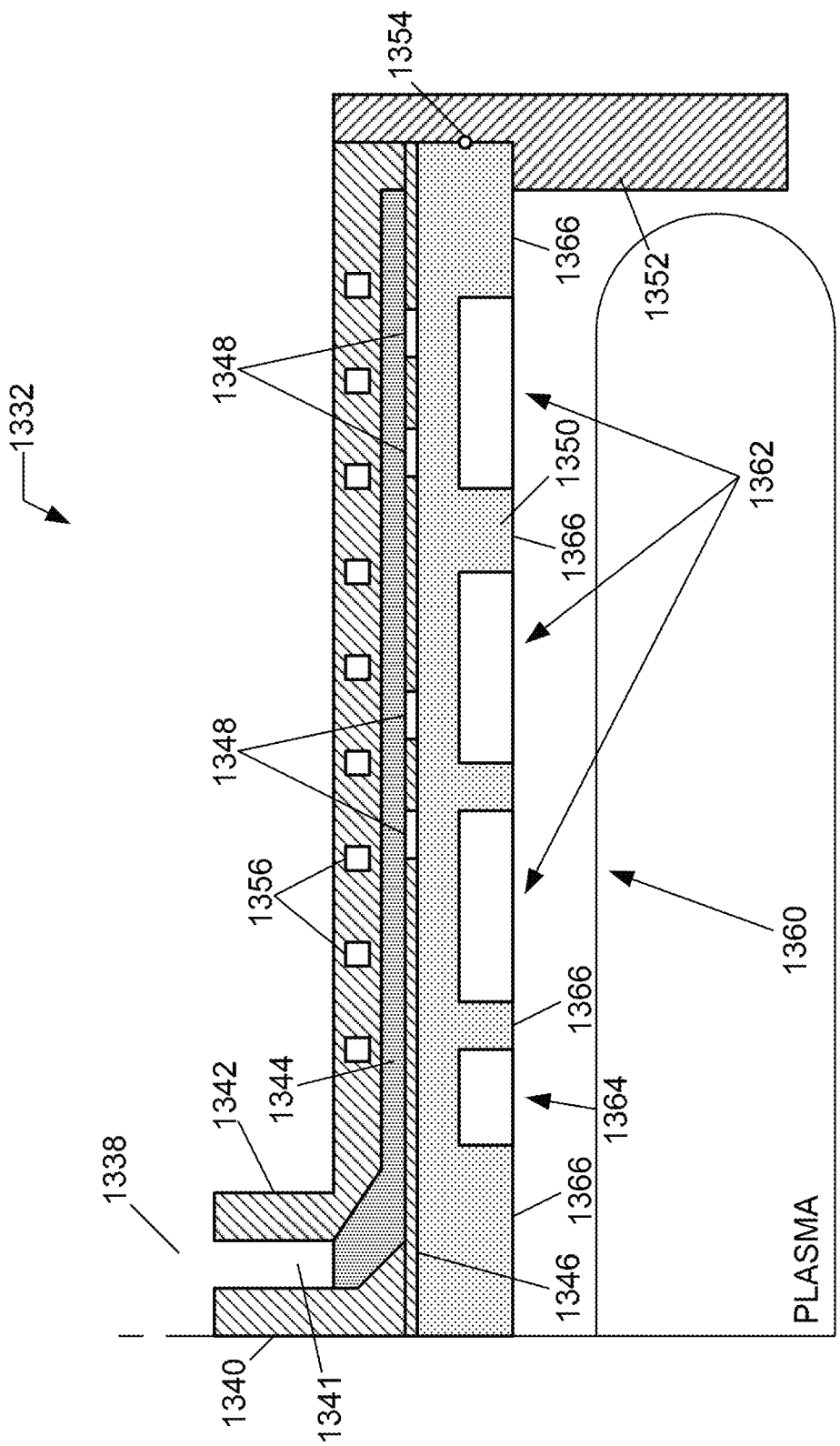
FIGS. 13A and 13B depict a cross-sectional view and bottom view of a plasma source in accordance with one embodiment of the invention.
Figure 13B:
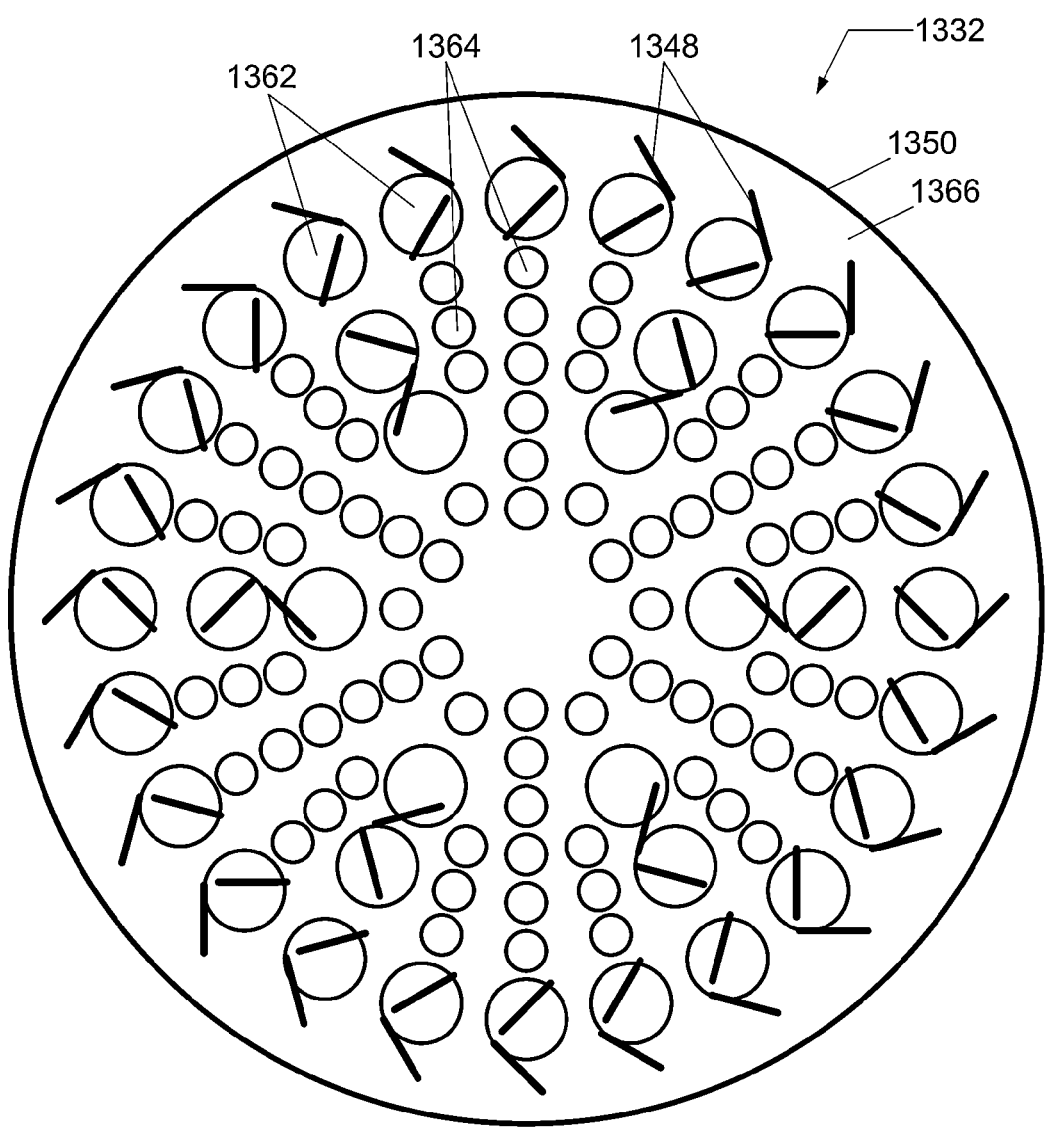

Referring now to FIGS. 13A and 13B, a schematic cross-sectional view and a bottom view, respectively, of an EM wave launcher 1332 are provided according to one embodiment. The EM wave launcher 1332 comprises a coaxial feed 1338 having an inner conductor 1340, an outer conductor 1342, and insulator 1341, such as an air gap, and a slot antenna 1346 having a plurality of slots 1348 coupled between the inner conductor 1340 and the outer conductor 1342 as shown in FIG. 13A. The plurality of slots 1348 permits the coupling of EM energy from a first region above the slot antenna 1346 to a second region below the slot antenna 1346, wherein plasma is formed adjacent a plasma surface 1360 on the EM wave launcher 1332. The EM wave launcher 1332 may further comprise a slow wave plate 1344, and a resonator plate 1350.

The number, geometry, size, and distribution of the slots 1348 are all factors that can contribute to the spatial uniformity of the plasma formed in the first process space 712 (see FIG. 7A). Thus, the design of the slot antenna 1346 may be used to control the spatial uniformity of the plasma in the first process space 712 (see FIG. 7A).

As shown in FIG. 13A, the EM wave launcher 1332 may comprise a fluid channel 1356 that is configured to flow a temperature control fluid for temperature control of the EM wave launcher 1332. Although not shown, the EM wave launcher 1332 may further be configured to introduce a process gas through the plasma surface 1360 to the plasma.

Referring still to FIG. 13A, the EM wave launcher 1332 may be coupled to an upper chamber portion of a plasma processing system, wherein a vacuum seal can be formed between an upper chamber wall 1352 and the EM wave launcher 1332 using a sealing device 1354. The sealing device 1354 can include an elastomer O-ring; however, other known sealing mechanisms may be used.

In general, the inner conductor 1340 and the outer conductor 1342 of the coaxial feed 1338 comprise a conductive material, such as a metal, while the slow wave plate 1344 and the resonator plate 1350 comprise a dielectric material. In the latter, the slow wave plate 1344 and the resonator plate 1350 preferably comprise the same material; however, different materials may be used. The material selected for fabrication of the slow wave plate 1344 is chosen to reduce the wavelength of the propagating electromagnetic (EM) wave relative to the corresponding free-space wavelength, and the dimensions of the slow wave plate 1344 and the resonator plate 1350 are chosen to ensure the formation of a standing wave effective for radiating EM energy into the first process space (712, 812) (See FIGS. 7A and 8A).

The slow wave plate 1344 and the resonator plate 1350 can be fabricated from a dielectric material, including silicon-containing materials such as quartz (silicon dioxide), or a high dielectric constant (high-k) materials. For example, the high-k material may possess a dielectric constant greater than a value of 4. In particular, when the plasma processing system is utilized for etch process applications, quartz is often chosen for compatibility with the etch process.

For example, the high-k material can include intrinsic crystal silicon, alumina ceramic, aluminum nitride, and sapphire. However, other high-k materials may be used. Moreover, a particular high-k material may be selected in accordance with the parameters of a particular process. For example, when the resonator plate 1350 is fabricated from intrinsic crystal silicon, the plasma frequency exceeds 2.45 GHz at a temperature of 45 degrees C. Therefore, intrinsic crystal silicon is appropriate for low temperature processes (i.e., less than 45 degrees C.). For higher temperature processes, the resonator plate 1350 can be fabricated from alumina ($Al_2O_3$), or sapphire.

Plasma uniformity and plasma stability remain as challenges for the practical implementation of a SWP source as described above. In the latter, the standing wave at the resonator plate-plasma interface, i.e., at the plasma surface 1360, may be prone to mode jumps as plasma parameters shift.

As shown in FIGS. 13A and 13B, the EM wave launcher 1332 may be fabricated with a first recess configuration 1362 formed in the plasma surface 1360 and optionally a second recess configuration 1364 formed in the plasma surface 1360 according to one embodiment.

The first recess configuration 1362 may comprise a first plurality of recesses. Each recess in the first recess configuration 1362 may comprise a unique indentation or dimple formed within the plasma surface 1360. For example, a recess in the first recess configuration 1362 may comprise a cylindrical geometry, a conical geometry, a frusto-conical geometry, a spherical geometry, an aspherical geometry, a rectangular geometry, a pyramidal geometry, or any arbitrary shape. The first recess distribution 1362 may comprise recesses characterized by a first size (e.g., latitudinal dimension (or width), and/or longitudinal dimension (or depth)).

The second recess configuration 1364 may comprise a plurality of recesses. Each recess in the second recess configuration 1364 may comprise a unique indentation or dimple formed within the plasma surface 1360. For example, a recess in the second recess configuration 1364 may comprise a cylindrical geometry, a conical geometry, a frusto-conical geometry, a spherical geometry, an aspherical geometry, a rectangular geometry, a pyramidal geometry, or any arbitrary shape. The second recess distribution 1364 may comprise recesses characterized by a second size (e.g., latitudinal dimension (or width), and/or longitudinal dimension (or depth)). The first size of the recesses in the first recess configuration 1362 may or may not be the same as the second size of the recesses in the second recess configuration 1364. For instance, the second size may be smaller than the first size.

As shown in FIGS. 13A and 13B, the resonator plate 1350 comprises a dielectric plate having a plate diameter and a plate thickness. Therein, the plasma surface 1360 on resonator plate 1350 comprises a planar surface 1366 within which the first recess configuration 1362 and the second recess configuration 1364 are formed. Alternatively, the resonator plate 1350 comprises a non-planar geometry or an arbitrary geometry. Therein, the plasma surface 1360 may comprise a non-planar surface within which the first recess configuration and the second recess configuration are formed (not shown). For example, the non-planar surface may be concave, or convex, or a combination thereof.

The propagation of EM energy in the resonator plate 1350 may be characterized by an effective wavelength ($\lambda$) for a given frequency of EM energy and dielectric constant for the resonator plate 1350. The plate thickness may be an integer number of quarter wavelengths ($n\lambda/4$, where n is an integer greater than zero) or an integer number of half wavelengths ($m\lambda/2$, where m is an integer greater than zero). For instance, the plate thickness may be about half the effective wavelength ($\lambda/2$) or greater than half the effective wavelength ($>\lambda/2$). Alternatively, the plate thickness may be a non-integral fraction of the effective wavelength (i.e., not an integral number of half or quarter wavelengths). Alternatively yet, the plate thickness may range from about 25 mm (millimeters) to about 45 mm.

As an example, the first recess configuration 1362 may comprise a first plurality of cylindrical recesses, wherein each of the first plurality of cylindrical recesses is characterized by a first depth and a first diameter. As shown in FIG. 13B, the first recess configuration 1362 is located near an outer region of the plasma surface 1360.

The first diameter may be an integer number of quarter wavelengths (n$\lambda$/4, where n is an integer greater than zero), or an integer number of half wavelengths (m$\lambda$/2, where m is an integer greater than zero), or a non-integral fraction of the effective wavelength. Additionally, a first difference between the plate thickness and the first depth may be an integer number of quarter wavelengths (n$\lambda$/4, where n is an integer greater than zero), or an integer number of half wavelengths (m$\lambda$/2, where m is an integer greater than zero), or a non-integral fraction of the effective wavelength. For instance, the first diameter may be about half the effective wavelength ($\lambda$/2), and the first difference between the plate thickness and the first depth may be about half the effective wavelength ($\lambda$/2) or about quarter the effective wavelength ($\lambda$/4). Additionally, for instance, the plate thickness may be about half the effective wavelength ($\lambda$/2) or greater than half the effective wavelength (>$\lambda$/2).

Alternatively, the first diameter may range from about 25 mm to about 35 mm, and the first difference between the plate thickness and the first depth may range from about 10 mm to about 35 mm. Alternatively yet, the first diameter may range from about 30 mm to about 35 mm, and the first difference may range from about 10 mm to about 20 mm. Alternatively yet, the first diameter and/or first depth may be a fraction of the plate thickness.

In the first recess configuration 1362, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma surface 1360. For example, the surface radius may range from about 1 mm to about 3 mm.

As another example, the second recess configuration 1364 may comprise a second plurality of cylindrical recesses, each of the second plurality of cylindrical recesses being characterized by a second depth and a second diameter. As shown in FIG. 13B, the second recess configuration 1364 is located near an inner region of the plasma surface 1360.

The second diameter may be an integer number of quarter wavelengths (n$\lambda$/4, where n is an integer greater than zero), or an integer number of half wavelengths (m$\lambda$/2, where m is an integer greater than zero), or a non-integral fraction of the effective wavelength. Additionally, a second difference between the plate thickness and the second depth may be an integer number of quarter wavelengths (n$\lambda$/4, where n is an integer greater than zero), or an integer number of half wavelengths (m$\lambda$/2, where m is an integer greater than zero), or a non-integral fraction of the effective wavelength. For instance, the second diameter may be about half the effective wavelength ($\lambda$/2), and the second difference between the plate thickness and the second depth may be about half the effective wavelength ($\lambda$/2) or about quarter the effective wavelength ($\lambda$/4). Additionally, for instance, the plate thickness may be about half the effective wavelength ($\lambda$/2) or greater than half the effective wavelength (>$\lambda$/2).

Alternatively, the second diameter may range from about 25 mm to about 35 mm, and the second difference between the plate thickness and the second depth may range from about 10 mm to about 35 mm. Alternatively yet, the second diameter may range from about 30 mm to about 35 mm, and the second difference may range from about 10 mm to about 20 mm. Alternatively yet, the second diameter and/or second depth may be a fraction of the plate thickness.

In the second recess configuration 1364, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma surface 1360. For example, the surface radius may range from about 1 mm to about 3 mm.

Referring again to FIG. 13B, a bottom view of the EM wave launcher 1332 depicted in FIG. 13A is provided. The plurality of slots 1348 in slot antenna 1346 are illustrated as if one can see through resonator plate 1350 to the slot antenna 1346. As shown in FIG. 13B, the plurality of slots 1348 may be arranged in pairs, wherein each of the pair of slots comprises a first slot oriented orthogonal to a second slot. However, the orientation of slots in the plurality of slots 1348 may be arbitrary. For example, the orientation of slots in the plurality of slots 1348 may be according to a pre-determined pattern for plasma uniformity and/or plasma stability.

The first recess configuration 1362 is substantially aligned with a first arrangement of slots in the plurality of slots 1348. Therein, at least one recess of the first recess configuration 1362 may be aligned, partially aligned, or not aligned with one or more of the plurality of slots 1348. The second recess configuration 1364 is either partly aligned with a second arrangement of slots in the plurality of slots 1348 or not aligned with the second arrangement of slots in the plurality of slots 1348. As shown in FIG. 13B, the second recess configuration 1364 is not aligned with the second arrangement of slots in the plurality of slots 1348.

As a consequence, the arrangement of the first and second recess configurations 1362, 1364 and their alignment with one or more of the plurality of slots 1348 may be optimized to control and/or improve plasma uniformity and/or stability. Additional details regarding the design of the plasma surface 1360 and the EM wave launcher 1332 can be found in U.S. pat. application Ser. No. 12/555,080, entitled "Stable surface wave plasma source", and filed on Sep. 8, 2009; the content of which is herein incorporated by reference in its entirety.

Figure 14:
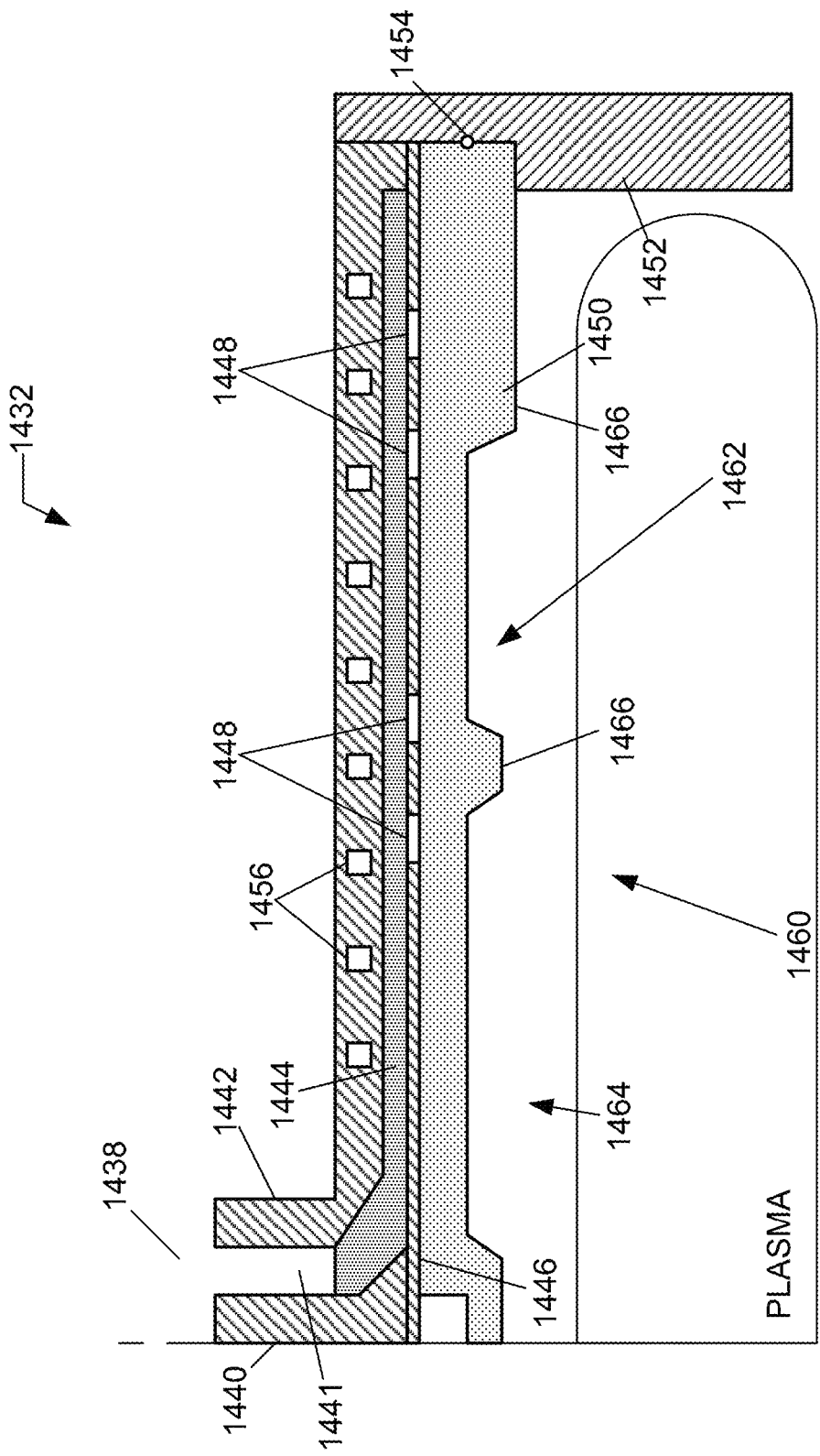
FIG. 14 depicts a cross-sectional view of a plasma source in accordance with another embodiment of the invention.

Referring now to FIG. 14, a schematic cross-sectional view of an EM wave launcher 1432 is provided according to another embodiment. The EM wave launcher 1432 comprises the coaxial feed 1438 having an inner conductor 1440, an outer conductor 1442, and insulator 1441, such as an air gap, and a slot antenna 1446 having a plurality of slots 1448 coupled between the inner conductor 1440 and the outer conductor 1442 as shown in FIG. 14. The plurality of slots 1448 permits the coupling of EM energy from a first region above the slot antenna 1446 to a second region below the slot antenna 1446, wherein plasma is formed adjacent a plasma surface 1460 on the EM wave launcher 1432. The EM wave launcher 1432 may further comprise a slow wave plate 1444, and a resonator plate 1450.

The number, geometry, size, and distribution of the slots 1448 are all factors that can contribute to the spatial uniformity of the plasma formed in the first process space 712 (see FIG. 7A). Thus, the design of the slot antenna 1446 may be used to control the spatial uniformity of the plasma in the first process space 712 (see FIG. 7A).

As shown in FIG. 14, the EM wave launcher 1432 may comprise a fluid channel 1456 that is configured to flow a temperature control fluid for temperature control of the EM wave launcher 1432. Although not shown, a material gas supply system, such as the second material gas supply system (742, 842, 942) of FIGS. 7A, 8A, and 9, may be connected to the EM wave launcher 1432 and/or the chamber wall 1452 for introducing a process gas into the process chamber.

Referring still to FIG. 14, the EM wave launcher 1432 may be coupled to an upper chamber portion of a plasma processing system, wherein a vacuum seal can be formed between an upper chamber wall 1452 and the EM wave launcher 1432 using a sealing device 1454. The sealing device 1454 can include an elastomer O-ring; however, other known sealing mechanisms may be used.

In general, the inner conductor 1440 and the outer conductor 1442 of the coaxial feed 1438 comprise a conductive material, such as a metal, while the slow wave plate 1444 and the resonator plate 1450 comprise a dielectric material. In the latter, the slow wave plate 1444 and the resonator plate 1450 preferably comprise the same material; however, different materials may be used. The material selected for fabrication of the slow wave plate 1444 is chosen to reduce the wavelength of the propagating electromagnetic (EM) wave relative to the corresponding free-space wavelength, and the dimensions of the slow wave plate 1444 and the resonator plate 1450 are chosen to ensure the formation of a standing wave effective for radiating EM energy into the first process space (712, 812) (See FIGS. 7A and 8A).

The slow wave plate 1444 and the resonator plate 1450 can be fabricated from a dielectric material, including silicon-containing materials such as quartz (silicon dioxide), or a high dielectric constant (high-k) materials. For example, the high-k material may possess a dielectric constant greater than a value of 4. In particular, when the plasma processing system is utilized for etch process applications, quartz is often chosen for compatibility with the etch process.

For example, the high-k material can include intrinsic crystal silicon, alumina ceramic, aluminum nitride, and sapphire. However, other high-k materials may be used. Moreover, a particular high-k material may be selected in accordance with the parameters of a particular process. For example, when the resonator plate 1450 is fabricated from intrinsic crystal silicon, the plasma frequency exceeds 2.45 GHz at a temperature of 45 degrees C. Therefore, intrinsic crystal silicon is appropriate for low temperature processes (i.e., less than 45 degrees C.). For higher temperature processes, the resonator plate 1450 can be fabricated from alumina ($Al_2O_3$), or sapphire.

Plasma uniformity and plasma stability remain as challenges for the practical implementation of a SWP source as described above. In the latter, the standing wave at the resonator plate-plasma interface, i.e., at the plasma surface 1460, may be prone to mode jumps as plasma parameters shift.

As shown in FIG. 14, the EM wave launcher 1432 may be fabricated with a first recess configuration 1462 formed in the plasma surface 1460 and optionally a second recess configuration 1464 formed in the plasma surface 1460 according to one embodiment.

The first recess configuration 1462 may comprise a first channel recess. For example, the first channel recess in the first recess configuration 1462 may include a cross-section that has a frusto-conical geometry. However, other geometries may be used, e.g., a spherical geometry, an aspherical geometry, a rectangular geometry, a pyramidal geometry, or any arbitrary shape. The first recess distribution 1462 may comprise a channel recess characterized by a first size (e.g., latitudinal dimension (or width), and/or longitudinal dimension (or depth)).

The second recess configuration 1464 may comprise a second channel recess. For example, the second channel recess in the second recess configuration 1464 may include a cross-section that has a frusto-conical geometry. However, other geometries may be used, e.g., a spherical geometry, an aspherical geometry, a rectangular geometry, a pyramidal geometry, or any arbitrary shape. The second recess distribution 1464 may comprise a channel recess characterized by a second size (e.g., latitudinal dimension (or width), and/or longitudinal dimension (or depth)). The first size of the first channel recess in the first recess configuration 1462 may or may not be the same as the second size of the second channel recess in the second recess configuration 1464. For instance, the second size may be larger than the first size.

As shown in FIG. 14, the resonator plate 1450 comprises a dielectric plate having a plate diameter and a plate thickness. Therein, the plasma surface 1460 on resonator plate 1450 comprises a planar surface 1466 within which the first recess configuration 1462 and the second recess configuration 1464 are formed. Alternatively, the resonator plate 1450 comprises a non-planar geometry or an arbitrary geometry. Therein, the plasma surface 1460 may comprise a non-planar surface within which the first recess configuration and the second recess configuration are formed (not shown). For example, the non-planar surface may be concave, or convex, or a combination thereof.

The arrangement of the first and second recess configurations (1462, 1464) and their alignment with one or more of the plurality of slots 1448 may be optimized to control and/or improve plasma uniformity and/or stability. Additional details regarding the design of the plasma surface 1460 and the EM wave launcher 1432 can be found in U.S. pat. application Ser. No. 10/570,631, entitled "Plasma processing equipment", filed on Dec. 19, 2006, and published as U.S. Pat. Application Publication No. 2007/0113788A1; the content of which is herein incorporated by reference in its entirety.

Figure 15:
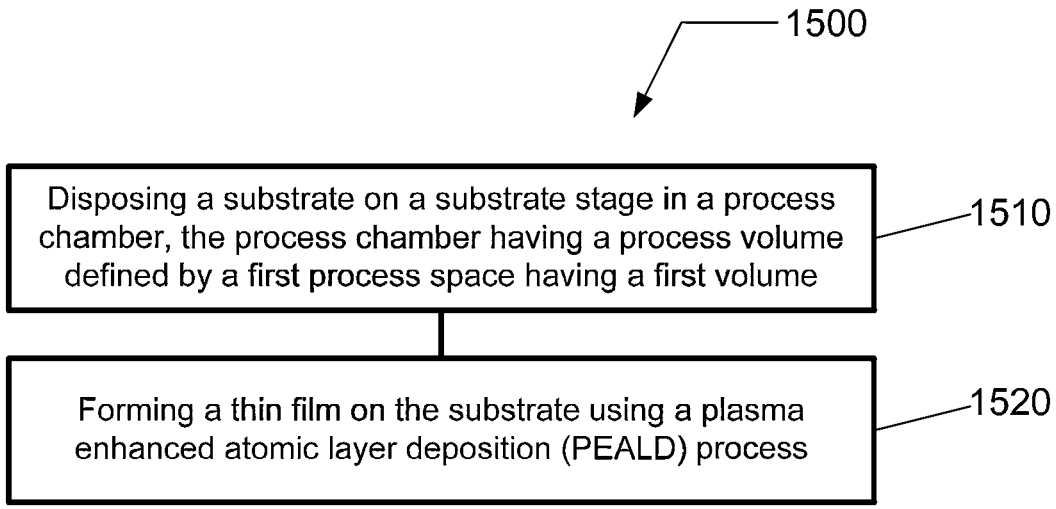
FIG. 15 shows a process flow diagram of a process in accordance with one embodiment of the invention.
Figure 16:
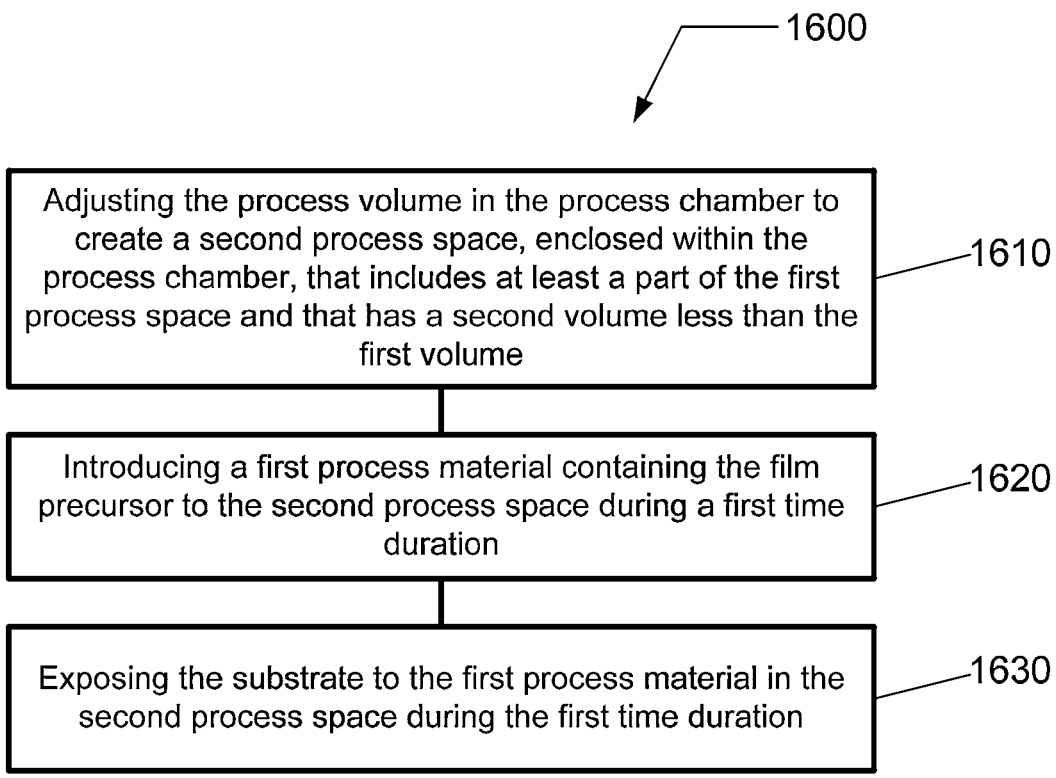
FIG. 16 shows a process flow diagram of a process in accordance with another embodiment of the invention.
Figure 17:
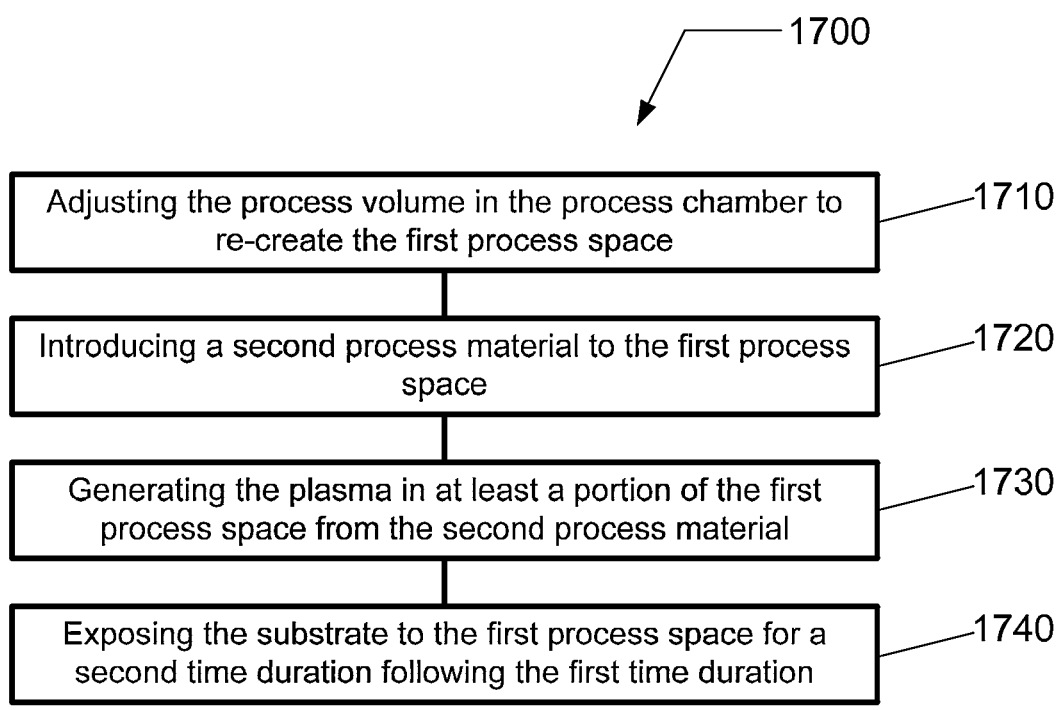
FIG. 17 shows a process flow diagram of a process in accordance with yet another embodiment of the invention.

Turning now to FIGS. 15 through 17, a method for plasma-assisted thin film vapor deposition on a substrate is schematically illustrated in a flow chart 1500 in accordance with one embodiment. The method begins in 1510 with disposing a substrate on a substrate stage in a process chamber, wherein the process chamber has a process volume defined by a first process space having a first volume.

In 1520, a thin film is formed on the substrate using a plasma enhanced atomic layer deposition (PEALD) process. The PEALD process may include: (i) introducing a film precursor to a surface of the substrate; and (ii) reacting the film precursor on the surface of the substrate with plasma to form the thin film. The introducing of the film precursor and the reacting of the film precursor on the surface of the substrate with plasma may be repeated one or more deposition cycles to produce the thin film with a pre-specified thickness.

As described above, a method for introducing the film precursor to the surface of the substrate is schematically illustrated in a flow chart 1600 in FIG. 16. The method begins in 1610 with adjusting the process volume in the process chamber to create a second process space, enclosed within the process chamber, that includes at least a part of the first process space and that has a second volume less than the first volume.

The adjustment to the process volume to create the second process space may include substantially isolating the second process space from at least a portion of the first process space. Alternatively, the adjustment to the process volume to create the second process space may include completely isolating the second process space from at least a portion of the first process space.

By separating and/or isolating the second process space from the first process space, the process step for introduction of the film precursor may be performed in a small, separated and/or isolated process volume, and the process step for reaction of the adsorbed film precursor with plasma may be performed in a larger process volume. In doing so, the introduction and purge of film precursor to the smaller process volume may, among other things, reduce evacuation time, reduce contamination of wall surfaces (i.e., substrate stage, plasma source, etc.) in the processing chamber by film precursor, reduce the consumption of film precursor, etc.

In 1620, a first process material containing the film precursor is introduced to the second process space during a first time duration and, in 1630, the substrate is exposed to the first process material in the second process space during the first time duration. Following the exposing step and preceding the reacting of the film precursor on the surface of the substrate with plasma to form the thin film, the second process space may be purged with a purge gas to leave a single layer of the film precursor. For example, as shown in FIGS. 7A and 8A, the process volume adjustment system (780, 880) may be positioned to separate and/or isolate the second process space (714, 814) from the first process space (712, 812).

As described above, a method for reacting the film precursor on the surface of the substrate with plasma to form the thin film is schematically illustrated in a flow chart 1700 in FIG. 17. The method begins in 1710 with adjusting the process volume in the process chamber to re-create the first process space. For example, as shown in FIGS. 7B, 7C, 8B, and 8C, the process volume adjustment system (780, 880) may be translated and/or rotated to and positioned within the storage space (715, 815) to open the exposure of substrate (725, 825) to the first process space (712, 812).

In 1720, a second process material is introduced to the first process space.

In 1730, plasma is generated in at least a portion of the first process space from the second process material.

In 1740, the substrate is exposed to the first process space for a second time duration following the first time duration.

As an example, the introduction of the first process material, the second process material, and/or the purge gas may proceed according to the schematic timing diagram provided in FIG. 5.

The generation of plasma may be continuous, or it may be intermittent. For example, the plasma may be maintained during the first time duration and the second time duration. Alternatively, for example, the plasma may be maintained during the second time duration and extinguished prior to or during the first time duration (e.g., see FIG. 5).

Although only certain exemplary embodiments of inventions have been described in detail above, those skilled in the art will readily appreciate that many modifications are possible in the exemplary embodiments without materially departing from the novel teachings and advantages of this invention.

What is claimed is:

1. A system for plasma-assisted thin film vapor deposition on a substrate, comprising:
    a processing chamber including a first process space having a first volume;
    a substrate stage coupled to said processing chamber and configured to support a substrate and expose said substrate to said first process space;
    a plasma generation system coupled to said processing chamber and configured to generate plasma in at least a portion of said first process space;
    a process volume adjustment mechanism coupled to said processing chamber and including a movable enclosure device;
    said movable enclosure device, upon insertion into the first process space, forming a second process space that includes at least a part of the first process space and that has a second volume less than said first volume, said substrate being exposed to said second process space;
    said moveable enclosure device having a gas manifold configured both to introduce a first process material to said second process space and to evacuate the second process space; and
    a vacuum pumping system coupled to said processing chamber and configured to evacuate at least a portion of said first process space, wherein
    said movable enclosure device is configured to extend into said processing chamber by moving laterally into the first process space and across the substrate stage, to move longitudinally to contact said substrate stage, and to isolate said second process space from at least a portion of said first process space.

2. The system of claim 1, wherein said movable enclosure device is configured to horizontally translate into and out of said processing chamber, and vertically translate to isolate said second process space from at least a portion of said first process space.

3. The system of claim 1, wherein said movable enclosure device is configured to rotate about an axis parallel with said substrate and isolate said second process space from at least a portion of said first process space.

4. A system for plasma-assisted thin film vapor deposition on a substrate, comprising:
    a processing chamber including a first process space having a first volume;
    a substrate stage coupled to said processing chamber and configured to support a substrate and expose said substrate to said first process space;
    a plasma generation system coupled to said processing chamber and configured to generate plasma in at least a portion of said first process space;
    a process volume adjustment mechanism coupled to said processing chamber and including a movable enclosure device;
    said movable enclosure device, upon insertion into the first process space, forming a second process space that includes at least a part of the first process space and that has a second volume less than said first volume, said substrate being exposed to said second process space;
    said moveable enclosure device having a gas manifold configured both to introduce a first process material to said second process space and to evacuate the second process space; and
    a vacuum pumping system coupled to said processing chamber and configured to evacuate at least a portion of said first process space, wherein said movable enclosure device is configured to rotate about an axis perpendicular to said substrate, and vertically translate to isolate said second process space from at least a portion of said first process space.

5. The system of claim 1, further comprising:
    a first process material gas supply system coupled to said processing chamber and configured to introduce the first process material to said second process space through said movable enclosure device and the gas manifold thereof.

6. The system of claim 5, wherein said vacuum pumping system is coupled to said second process space through said movable enclosure device and configured to evacuate said second process space.

7. The system of claim 5, further comprising:
a second process material gas supply system coupled to said processing chamber and configured to introduce a second process material to said first process space.

8. The system of claim 1, wherein said plasma generation system comprises a surface wave plasma source.

9. The system of claim 8, wherein said surface wave plasma source comprises:
an electromagnetic (EM) wave launcher configured to couple EM energy in a desired EM wave mode to said plasma by generating a surface wave on a plasma surface of said EM wave launcher adjacent said plasma, said EM wave launcher comprises a slot antenna having a plurality of slots formed there through configured to couple said EM energy from a first region above said slot antenna to a second region below said slot antenna;
a resonator plate positioned in said second region and having a lower surface of said resonator plate including said plasma surface of the EM wave launcher; and
a power coupling system coupled to said EM wave launcher and configured to provide said EM energy to said EM wave launcher for forming said plasma,
wherein said power coupling system comprises:
a microwave source configured to produce microwave energy at 2.45 GHz;
a waveguide coupled to an outlet of said microwave source;
an isolator coupled to said waveguide and configured to prevent propagation of microwave energy back to said microwave source;
a coaxial feed for coupling EM energy to said EM wave launcher, and
a coaxial converter coupled to said isolator and configured to couple said microwave energy to said coaxial feed,
wherein said slot antenna comprises one end coupled to an inner conductor of said coaxial feed and another end coupled to an outer conductor of said coaxial feed.

10. The system of claim 1, further comprising:
a controller coupled to said processing chamber, said substrate stage, said plasma generation system, said process volume adjustment mechanism, and said vacuum pumping system, and configured to execute a plasma enhanced atomic layer deposition (PEALD) process in said processing chamber.

11. The system of claim 1, further comprising a first process material gas supply system configured to introduce a film precursor to said second process space, and a second process material gas supply system configured to introduce a plasma excitation gas to said first process space.

12. The system of claim 1, further comprising:
a temperature control system coupled to said substrate stage and configured to elevate and control a temperature of said substrate.

13. The system of claim 1, further comprising:
a substrate bias system coupled to said substrate stage and configured to couple at least one of a DC (direct current) voltage or an RF (radio frequency) voltage to said substrate stage at a frequency from 0.1 to 100 MHz.

14. The system of claim 1, further comprising:
a purge gas supply system coupled to said processing chamber and configured to introduce a purge gas to at least a portion of said first process space.

15. A system for plasma-assisted thin film vapor deposition on a substrate, comprising:
a processing chamber including a first process space having a first volume;
a substrate stage coupled to said processing chamber and configured to support a substrate and expose said substrate to said first process space;
a plasma generation system coupled to said processing chamber and configured to generate plasma in at least a portion of said first process space;
a process volume adjustment mechanism coupled to said processing chamber and including a movable enclosure device;
said movable enclosure device, upon insertion into the first process space, forming a second process space that includes at least a part of the first process space and that has a second volume less than said first volume, said substrate being exposed to said second process space;
said moveable enclosure device having a gas manifold configured to introduce a first process material to said second process; and
a vacuum pumping system coupled to said processing chamber and configured to evacuate at least a portion of said first process space,
wherein said movable enclosure device is configured to extend into said processing chamber by moving laterally into the first process space and across the substrate stage, to move longitudinally to contact said substrate stage, and to isolate said second process space from at least a portion of said first process space.

* * * * *